US008644711B2

(12) United States Patent
Kim et al.

(10) Patent No.: US 8,644,711 B2
(45) Date of Patent: *Feb. 4, 2014

(54) APPARATUS AND METHOD FOR OLT AND ONU FOR WAVELENGTH AGNOSTIC WAVELENGTH-DIVISION MULTIPLEXED PASSIVE OPTICAL NETWORKS

(75) Inventors: Byoung-Whi Kim, Daejeon (KR); Manyong Park, Seoul (KR); Woo-Ram Lee, Daejeon (KR); Bong-Tae Kim, Daejeon (KR); Seung-Hyun Cho, Daejeon (KR); Jie-Hyun Lee, Daejeon (KR); Geon Jeong, Daejeon (KR); Chulyoung Kim, Gwangju (KR); Dae-Ung Kim, Daejeon (KR); Byung-Yong Kang, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 756 days.

This patent is subject to a terminal disclaimer.

(21) Appl. No.: 12/445,935

(22) PCT Filed: Jul. 6, 2007

(86) PCT No.: PCT/KR2007/003308
§ 371 (c)(1),
(2), (4) Date: Oct. 18, 2010

(87) PCT Pub. No.: WO2008/047996
PCT Pub. Date: Apr. 24, 2008

(65) Prior Publication Data
US 2011/0026923 A1 Feb. 3, 2011

(30) Foreign Application Priority Data

Oct. 20, 2006 (KR) .................. 10-2006-0102456
Jan. 4, 2007 (KR) .................. 10-2007-0001140
Mar. 9, 2007 (KR) .................. 10-2007-0023629
Jul. 6, 2007 (KR) .................. 10-2007-0068074

(51) Int. Cl.
*H04J 14/02* (2006.01)
*H04B 10/40* (2013.01)

(52) U.S. Cl.
USPC ............................. 398/137; 398/70; 398/91

(58) Field of Classification Search
USPC ............................................ 398/70, 91, 137
See application file for complete search history.

(56) References Cited

U.S. PATENT DOCUMENTS

| 5,467,219 A | 11/1995 | Ushirozawa |
| 2004/0120028 A1 | 6/2004 | Heim et al. |
| 2006/0233550 A1* | 10/2006 | Shin et al. ................. 398/79 |

FOREIGN PATENT DOCUMENTS

| JP | 05-191355 | 7/1993 |
| JP | 2004-282742 | 10/2004 |
| JP | 2006-217599 | * 8/2006 |
| JP | 2006-262020 | 9/2006 |
| JP | 2006-269926 | 10/2006 |
| JP | 2006-304306 | * 11/2006 |
| KR | 1020050032286 A | 4/2005 |
| KR | 10-2006-0088268 A | 8/2006 |
| KR | 1020060088268 A | 8/2006 |
| KR | 1020060100127 A | 9/2006 |
| KR | 10-2007-0061119 A | 6/2007 |

OTHER PUBLICATIONS

Lee, et al., "Optical Transceiver Employing an RSOA with Feed-Forward Current Injection," OFC/NFOEC 2007 Conference, Mar. 27, 2007.

Office Action issued for Russian Patent Application No. 2009/114694, received Jan. 22, 2010 from the Patent Office of the Russian Federation.

* cited by examiner

Primary Examiner — Leslie Pascal
(74) Attorney, Agent, or Firm — Blakely Sokoloff Taylor & Zafman

(57) ABSTRACT

In a Wavelength-Division-Multiplexed Passive Optical Network (WDM-PON) utilizing a conventional downstream optical signal reusing method, there is an inventory problem that different optical transmitter types need to be provided for the operation, management, replacement, etc. of a system. A WDM-PON system according to the present invention, includes: a seed light (SL) unit generating a seed light whose wavelength intervals and center wavelengths are adjusted using at least one seed light source; an optical line terminal (OLT) receiving the wavelength-multiplexed seed light from the seed light unit, transmitting a downstream optical signal to a subscriber of the WDM-PON, and receiving a upstream optical signal from the subscriber; and an optical network unit (ONU) receiving the downstream optical signal from the OLT, flattening and modulating the downstream optical signal with upstream data so that the downstream optical signal is reused for carrying upstream data. It is possible to improve the quality and reliability of downstream transmission by sufficiently increasing an extinction ratio, and improve the quality and reliability of upstream transmission by sufficiently flattening an input downstream optical signal in a semiconductor optical amplifier.

16 Claims, 41 Drawing Sheets

APPARATUS AND METHOD FOR OLT AND ONU FOR WAVELENGTH AGNOSTIC WAVELENGTH-DIVISION MULTIPLEXED PASSIVE OPTICAL NETWORKS

This is a non-provisional application claiming the benefit of International application number PCT/KR2007/003308 filed Jul. 6, 2007.

TECHNICAL FIELD

The present invention relates to a method for flattening a modulated optical signal in a Reflective Semiconductor Optical Amplifier (RSOA) or Semiconductor Optical Amplifier (SOA) to reuse the resultant optical signal as a upstream optical signal, and more particularly, to a driving apparatus for improving the flatness of an input optical signal and reusing the optical signal by injecting a signal whose polarity is opposite to that of the optical signal to a RSOA, and a SOA structure therefor.

The present invention relates to a downstream optical transmission apparatus and method using a wavelength-agnostic light source in a Wavelength-Division-Multiplexed Passive Optical Network (WDM-PON), and an optical line terminal (OLT) using the downstream optical transmission apparatus, and more particularly, to a downstream optical transmission apparatus and method using a wavelength agnostic light source in a WDM-PON, which can effectively perform the management, operation, and maintenance/repair of an OLT on the WDM-PON at a low cost by using a multi-wavelength light source (MWLS) or broad-band light source (BLS) as a wavelength-agnostic light source and using an optical transmitter corresponding to the wavelength-agnostic light source in the OLT, and an OLT using the downstream optical transmission apparatus and method. The present invention relates to a network configuration method and a upstream/downstream optical communication apparatus that are used to configure a Dense Wavelength-Division-Multiplexed Passive Optical Network (DWDM-PON), and more particularly, to a network structure for achieving a hybrid WDM-TDMA-PON by combining a DWDM-PON or a WDM-PON with a Time Division Multiple Access (TDMA) technique, and an OLT and an Optical Network Unit (ONU) that are used in the network structure.

This work was supported by the IT R&D program of MIC/IITA [2007-S-014-01, Metro-Access Integrated Optical Network Technology].

BACKGROUND ART

In order to configure a wavelength-division-multiplexed passive optical network (WDM-PON) using a conventional Reflective Semiconductor Optical Amplifier (RSOA), there has been proposed a method in which an optical signal that was modulated into downstream data by a central office (CO) is transmitted to a RSOA of an optical network terminal (ONT) and the RSOA is operated at a gain saturation region with respect to the power of the input optical signal to greatly reduce a difference between level '0' and level '1' of the input optical signal when the input optical signal is remodulated to upstream data.

In such an optical signal reusing method, when the gain saturation of the RSOA occurs at lower optical power, an optical power budget in an optical link increases, and therefore, gain saturation power needs to be reduced to be as little as possible and an optical signal input to the RSOA needs to be amplified sufficiently for upstream transmission. Consequently, a gain of the RSOA needs to be large enough.

However, in actuality, the compressing ability of the RSOA in the gain saturation region is limited, and therefore, there is a limit in reducing an extinction ratio (ER) of the input optical sufficiently. In this case, when the residual extinction ratio is directly modulated by the upstream data again, the residual extinction ratio is reflected to the thickness of the level '1'. As the level '1' is thicker, upstream transmission quality is getting worse. If the level '1' is thicker than a certain thickness, the upstream transmission quality is getting worse rapidly.

Accordingly, the extinction ratio of a downstream optical signal may need to be decreased to a minimum, which is just enough for transmission. At this time, due to the low extinction ratio of the downstream optical signal, power penalty may occur in downstream transmission. Especially, when the optical wavelengths of apparatuses configuring a downstream link are even slightly misarranged, there appears sensitivity by which the extinction ratio of an optical signal input into a receiver is getting less than the extinction of an optical signal output from a transmitter, and the transmitting quality is getting worse rapidly.

Recently, against activation of sound/data/broadcast hybrid services, research and development for a Wavelength Division Multiplexing (WDM)-based network are actively progressed throughout the world.

Communications between a central base station and a terminal in a WDM-PON are performed using wavelengths which are designated in each terminal. In the WDM-PON, since a private wavelength is used for each terminal, excellent security is guaranteed, a large amount of communication services are possible, and different transmission techniques (for example, different data rates, different frame formats, etc.) can be applied to respective terminals or services.

A downstream optical wavelength reusing method, among a variety of WDM-PON configuration methods that have been proposed to date, generates a upstream optical signal by reusing a downstream optical wavelength. Thus, a upstream optical wavelength is equal to a downstream optical wavelength, a Free Spectral Range (FSR) of a WDM-based multiplexing/demultiplexing unit does not need to be considered, also a multi-stage remote node can be configured, and a variety of subscriber network types can be configured.

Hereinafter, a WDM-PON using the downstream optical signal reusing method will be described in detail.

FIG. 13 illustrates the configuration of a WDM-PON according to a conventional downstream optical signal reusing method. Referring to FIG. 13, the WDM-PON includes an Optical Line Terminal (OLT) 1300, an optical line 1310, a wavelength multiplexing/demultiplexing unit 1320, and Optical Network Units (ONUs) 1330.

First, the respective elements of the OLT 1300 will be described below, wherein the OLT 130 is located in a telephone office.

The OLT 1300, as illustrated in FIG. 13, includes a protocol processing unit 1301, a plurality of wavelength fixed optical transmitters Tx#1 through Tx#N 1302, a wavelength multiplexer 1303, an optical circulator 1304, a wavelength demultiplexer 1305, and a plurality of optical receivers 1306.

If a downstream electrical signal is transferred from the protocol processing unit 1301 to the wavelength fixed optical transmitters Tx#1 through Tx#N 1302, each wavelength fixed optical transmitter 1302 outputs an optical signal corresponding to the downstream electrical signal to the wavelength multiplexer 1303.

Then, the wavelength multiplexer 1303 combines optical signals received from the wavelength fixed optical transmitters Tx#1 through Tx#N 1302 with each other, and then transfers the resultant signal via the optical line 1310 to the wavelength multiplexing/demultiplexing unit 1320 which is located at a remote node. The optical signals are divided according to their wavelengths by the wavelength multiplexing/demultiplexing unit 1320. The wavelength multiplexing/demultiplexing unit 1320 operates as a wavelength demultiplexer when a downstream signal is received, and operates as a wave multiplexer when a upstream signal is received.

The optical signals which have been divided according to their wavelengths by the wavelength multiplexing/demultiplexing unit 1320 are transferred to the corresponding ONU 1330.

Hereinafter, the elements of each ONU 1330 will be described in detail. Here, each ONU 1330 includes a tap coupler 1331, an optical transmitter 1332, an optical receiver 1333, and a protocol processing unit 1334. Here, the optical transmitter 1332 may be a wavelength-agnostic semiconductor optical amplifier.

The tap combiner 1331 transfers some of downstream optical signals transmitted from the wavelength demultiplexer 1320 to the optical receiver 1333 to restore them as downstream signals, and transfers the remaining part of the downstream optical signals to the optical transmitter 1332.

Then, if the optical transmitter 1332 receives an upstream electrical signal from the protocol processing unit 1334, the optical transmitter 1332 generates a upstream optical signal by reusing the downstream optical signal received from the tap combiner 1331 and transmits the upstream optical signal to the ONU 1330.

Since the optical transmitter 1332 uses a semiconductor optical amplifier which is a wavelength agnostic light source, no inventory problem occurs and an optical transmitter type can process all WDM channels.

However, in the above-described WDM-PON using the conventional downstream optical signal reusing method, since an optical transmitter which is used in a telephone office on the WDM-PON is a wavelength fixed type optical transmitter (for example, a DFB-LD which outputs the same optical wavelength, a wavelength fixed external resonance laser, a Vertical Cavity Surface Emitting Laser (VCSEL), etc.) using a wavelength fixed light source, different types of optical transmitters corresponding to the number of wavelengths that are available in the telephone office are needed. The manufacturing, installation and management of light sources according to wavelengths give a great load to all of users and providers, and thus increase system costs. That is, in the WDM-PON according to the conventional downstream optical signal reusing method, an inventory problem occurs that different types of optical transmitters should be provided for the operation, management, replacement, etc. of systems.

DETAILED DESCRIPTION OF THE INVENTION

Technical Problem

The present invention provides a driving apparatus for flattening the optical power of an input optical signal to reuse the input optical signal as a upstream optical signal, regardless of the gain saturation of a Reflective Semiconductor Optical Amplifier (RSOA), by applying a current signal whose polarity is opposite to that of the input optical signal to the RSOA and thus dynamically adjusting the size of an optical power gain of the RSOA, and RSOA and Semiconductor Optical Amplifier (SOA) structures that are suitable to the driving apparatus.

The preset invention also provides a downstream optical transmission apparatus and method using a wavelength agnostic light source in a Wavelength-Division-Multiplexed Passive Optical Network (WDM-PON), which can efficiently perform the management, operation, and maintenance of an Optical Line Terminal (OLT) of the WDM-PON at a low cost, by using a Multi-Wavelength Light Source (MWLS) or a Broad-band Light Source (BLS) as a wavelength-agnostic light source and thus using an optical transmitter corresponding to the wavelength agnostic light source, and an OLT using the downstream optical transmission apparatus and method.

The present invention also provides a method for configuring an optical wavelength-agnostic OLT in a WDM-PON or in a WDM-TDMA-PON, by installing a MWLS or a BLS for outputting multi-wavelengths therein to inject a continuous wave (CW) output from the MWLS or BLS to an optical wavelength-agnostic semiconductor optical amplifier (SOA) so that the MWLS or BLS can be used as an optical transmission module.

Unlike wavelength independence of an OLT, wavelength independence of an Optical Network Unit (ONU) is achieved by transferring some of downstream optical signals received from an OLT to a photo diode (PD) so that each downstream optical signal is restored to an electronic signal through an electrical amplifier (for example, a transimpedance amplifier (TIA) or a limiting amplifier (LA)), and transferring the remaining region of the downstream optical signals to a semiconductor optical amplifier (SOA). In order to reuse each downstream optical signal input to the semiconductor optical amplifier as a upstream optical signal, it is necessary to erase downstream data included in the downstream optical signal through an optical wavelength reusing process. For that, the present invention proposes a Feed Forward Current Injection (FFCI) method.

Technical Solution

According to an aspect of the present invention, there is provided a Reflective Semiconductor Optical Amplifier (RSOA) driving circuit, including: a coupler splitting an input optical signal to a first signal and a second signal; a RSOA having a single active region which reflects the second signal from a reflective facet and to which a combination signal of a signal with polarity opposite to that of the second signal and a modulation signal for modulating the second signal reflected from the reflective facet to an output optical signal is injected; a data photo diode converting the first signal into a current signal; a transimpedance amplifier receiving the current signal from the data photo diode and amplifying the current signal into a voltage signal with polarity opposite to that of the first signal; a Radio Frequency (RF) amplifier receiving the voltage signal from the transimpedance amplifier and amplifying the voltage signal into a flattening signal suitable to flatten the optical amplitude of the second signal; an RF delay unit receiving the flattening signal from the RF amplifier and adjusting an output timing of the flattening signal so that the second signal is maximally flattened; and a signal combiner combining the flattening signal with the modulation signal and injecting the result of the combining to a single active region of the RSOA.

According to another aspect of the present invention, there is provided a downstream optical transmission apparatus using a wavelength agnostic light source, which is used in an optical line terminal of a Wavelength-Division-Multiplexed Passive Optical Network (WDM-PON), including: a seed light unit generating a multi-wavelength optical signal; a wavelength multiplexing/demultiplexing unit dividing the multi-wavelength optical signal according to wavelengths; an optical transmitter generating a downstream optical signal, using an optical signal received from the wavelength multiplexing/demultiplexing unit, in response to a plurality of electrical signals received from an external device; and a circulator transmitting the multi-wavelength optical signal to the wavelength multiplexing/demultiplexing unit, or transmitting an optical signal output from the wavelength multiplexing/demultiplexing unit to a subscriber party, wherein the wavelength multiplexing/demultiplexing unit combines a plurality of downstream optical signals generated by the optical transmitter with each other.

According to another aspect of the present invention, there is provided a Wavelength-Division-Multiplexed Passive Optical Network (WDM-PON) system including: a seed light generator generating a seed light whose wavelength interval and central wavelength are adjusted, using at least one seed light source; an optical line terminal (OLT) receiving the seed light from the seed light generator, transmitting a downstream optical signal to a subscriber of the WDM-PON, and receiving a upstream optical signal transmitted from the subscriber; an network unit (ONU) transmitting a upstream optical signal to which the downstream optical signal received from the OLT is modulated so that the downstream optical signal includes upstream data.

Advantageous Effects

In a Wavelength-Division-Multiplexed-Passive Optical Network (WDM-PON) in which a Reflective Semiconductor Optical Amplifier (RSOA) is used according to a downstream optical signal reusing method utilizing an amplitude compression effect in a gain saturation region, actually, since there is a limit in the compression performance of the RSOA in the gain saturated state, it is difficult to compress a downstream signal sufficiently so that upstream transmission is sufficiently possible, when the extinction ratio of the downstream signal is great. In order to resolve the problem, the present invention greatly reduces the extinction ratio of an input optical signal by dynamically adjusting current injected to a RSOA according to the amplitude of the input optical signal.

Accordingly, it is possible to further reduce the thickness of a level '1' of an upstream optical signal and thus reduce the power penalty of upstream transmission, thereby improving transmission quality. Also, since the extinction ratio of a downstream optical signal can be maintained at a value higher than a value which is generally used, it is possible to reduce downstream power penalty compared to a conventional method in which the extinction ratio of a downstream optical signal maintains low inevitably. Especially, it is possible to avoid sensitivity by which the extinction ratio of a downstream optical signal is getting less than an extinction ratio required for optical signal transmission and thus transmission quality is getting worse rapidly when the optical wavelengths of apparatuses configuring a downstream link are even slightly misarranged.

Consequently, the quality and reliability of downstream transmission can be improved by sufficiently increasing the extinction ratio of the downstream optical signal, and the quality and reliability of upstream transmission can be also improved by sufficiently flattening a modulated downstream optical signal in a RSOA.

As described above, according to the present invention, by inserting a Multi-Wavelength Light Source (MWLS) or a Broad-band Light Source (BLS) into an OLT and thus using a wavelength-agnostic semiconductor optical amplifier instead of a wavelength fixed type semiconductor optical amplifier, as an optical transmitter for the OLT, an inventory problem of the OLT can be resolved.

Also, according to the present invention, by making an interval between output optical wavelengths of a multi-wavelength light source to be less than a pass bandwidth of a wavelength multiplexing/demultiplexing unit so that a plurality of wavelengths exist for each WDM channel, it is possible to resolve the wavelength stability problem of the multi-wavelength light source and increase system stability.

As described above, according to the present invention, in the WDM-PON, wavelength independence of an OLT is achieved by injecting a seed light from a MWLS or BLS to the OLT and using a wavelength-agnostic optical transmitter for the OLT. Accordingly, since a single optical transmission part of an OLT can receive and process different wavelengths, the OLT can be implemented using the single optical transmission part regardless of the number of used WDM-based optical wavelengths.

Also, in order to achieve the wavelength independence of an ONU, the present invention proposes a method of dynamically adjusting current that is to be injected to a RSOA according to the amplitude of an input optical signal. Therefore, it is possible to further reduce the thickness of a level '1' of a upstream optical signal and thus reduce the power penalty of upstream transmission, thereby improving transmission quality.

Also, since the extinction ratio of a downstream optical signal can be maintained at a value higher than a value which is generally used, it is possible to reduce downstream power penalty compared to the conventional method in which the extinction ratio of a downstream optical signal is low inevitably, and avoid sensitivity by which the extinction ratio of a downstream optical signal is getting less than an extinction ratio required for optical signal transmission and thus transmission quality is getting worse rapidly when the optical wavelengths of apparatuses configuring a downstream link is even slightly misarranged.

Consequently, by causing the extinction ratio of a downstream optical signal to be sufficiently increased, it is possible to improve the quality and reliability of downstream transmission and sufficiently flatten an input downstream optical signal in a semiconductor light amplifier, thereby improving the quality and reliability of upstream transmission.

BEST MODE

Figure 1:
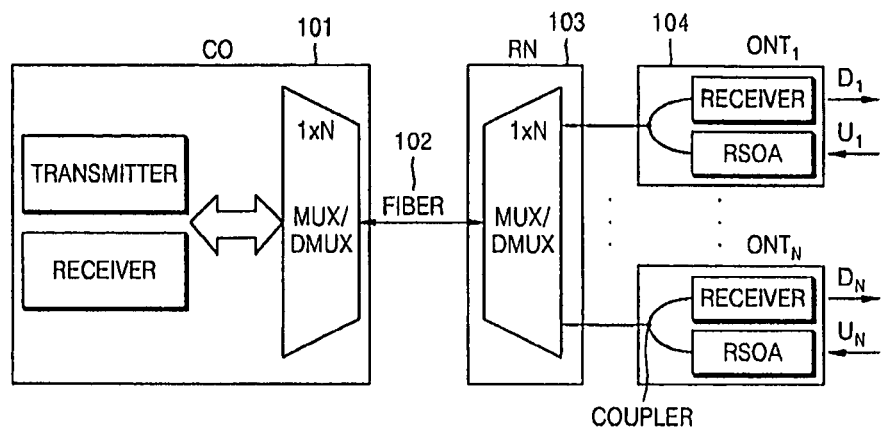
FIG. 1 is a conceptual diagram of a Wavelength-Division-Multiplexed Passive Optical Network (WDM-PON) based on a Reflective Semiconductor Optical Amplifier (RSOA) that reuses an optical signal.

According to an aspect of the present invention, there is provided a Reflective Semiconductor Optical Amplifier (RSOA) driving circuit, including: a coupler splitting an input optical signal to a first signal and a second signal; a RSOA having a single active region which reflects the second signal from a reflective facet and to which a combination signal of a signal with polarity opposite to that of the second signal and a modulation signal for modulating the second signal reflected from the reflective facet to generate an output optical signal is injected; a data photo diode converting the first signal into a current signal; a transimpedance amplifier receiving the current signal from the data photo diode and amplifying the current signal into a voltage signal with polarity opposite to that of the first signal; a Radio Frequency (RF) amplifier receiving the voltage signal from the transimpedance amplifier and amplifying the voltage signal into a flattening signal suitable to flatten the optical amplitude of the second signal; an RF delay unit receiving the flattening signal from the RF amplifier and adjusting an output timing of the flattening signal so that the second signal is maximally flattened; and a signal combiner combining the flattening signal with the modulation signal and injecting the result of the combining to a single active region of the RSOA.

Also, the reflective semiconductor optical amplifier has two active regions and includes an optical amplifier type semiconductor including the reflective facet that reflects an input optical signal; and an optical amplifying semiconductor comprising a rear region, which is positioned at a side of the reflective facet and to which a signal having polarity opposite to that of the input optical signal is injected, and a front region, which is positioned at a side opposite to the side of the rear region facing the reflective facet and which the input optical signal is passed though and the signal used to modulate a reflected input optical signal from the reflective facet to the output optical signal is injected into.

Also, the semiconductor optical amplifier includes three active regions: a first active region into which a signal with polarity opposite to that of an input optical signal is injected to flatten the amplitude of the input optical signal; a second active region; a second active region which is positioned at a side of the first active region and into which DC current is injected to optically amplify the input optical signal passing through the first active region; and a third active region which is positioned at the other side of the second active region and into which a signal for modulating the input optical signal passing through the second active region to an output optical signal is injected.

Also, the RSOA is an optical amplifier having two active regions and comprises the reflective facet that reflects an input optical signal; and an optical amplifying semiconductor comprising a rear region which is positioned at a side of the reflective facet and to which a signal having polarity opposite to that of the input optical signal is injected, and a front region which is positioned at the other side of the rear region and which the input optical signal is passed though and the signal for modulating the input optical signal reflected from the reflective facet to the output optical signal is injected into, wherein the flattening signal transmitted from the first LD driver is injected into the rear region of the RSOA having the two active regions, and wherein the signal for modulating the second signal to the output optical signal is injected into the front region of the RSOA having the two active regions.

According to another aspect of the present invention, there is provided a downstream optical transmission apparatus using a wavelength agnostic light source, which is used in an optical line terminal of a Wavelength-Division-Multiplexed Passive Optical Network (WDM-PON), including: a seed light unit generating a multi-wavelength optical signal; a wavelength multiplexing/demultiplexing unit dividing the multi-wavelength optical signal according to wavelengths; an optical transmitter generating a downstream optical signal, using an optical signal received from the wavelength multiplexing/demultiplexing unit, in response to a plurality of electrical signals received from an external device; and a circulator transmitting the multi-wavelength optical signal to the wavelength multiplexing/demultiplexing unit, or transmitting an optical signal output from the wavelength multiplexing/demultiplexing unit to a subscriber party, wherein the wavelength multiplexing/demultiplexing unit combines a plurality of downstream optical signals generated by the optical transmitter with each other.

According to another aspect of the present invention, there is provided an downstream optical transmission apparatus using a wavelength agnostic optical source, which is used in a Wavelength-Division-Multiplexed Passive Optical Network (WDM-PON), including: an seed light unit generating a broad-band optical signal; a wavelength multiplexing/demultiplexing unit dividing the broad-band optical signal according to wavelengths; an optical transmitter generating a downstream optical signal, using an optical signal received from the wavelength multiplexing/demultiplexing unit, in response to a plurality of electrical signals received from an external device; and a circulator transmitting the broad-band optical signal to the wavelength multiplexing/demultiplexing unit, or transmitting an optical signal output from the wavelength multiplexing/demultiplexing unit to a subscriber party, wherein the wavelength multiplexing/demultiplexing unit combines a plurality of downstream optical signals generated by the optical transmitter with each other.

According to another aspect of the present invention, there is provided a downstream optical transmission method using a wavelength agnostic optical source which is used by an optical line terminal (OLT) of a Wavelength-Division-Multiplexed Passive Optical Network (WDM-PON), including: generating a multi-wavelength optical signal using a multi-wavelength light source; dividing the multi-wavelength optical signal according to wavelengths; generating a plurality of downstream optical signals using each optical signal received and divided according to the wavelengths, in response to a plurality of electrical signals received from an external device; and combining the plurality of downstream optical signals with each other, and transmitting the result of the combining to a subscriber party through an optical line.

According to another aspect of the present invention, there is provided a downstream optical transmission method using a wavelength agnostic light source, which is used by an optical line terminal (OLT) of a Wavelength-Division-Multiplexed Passive Optical Network (WDM-PON), including: generating a broad-band optical signal using a broad-band light source (BLS); dividing the broad-band optical signal according to wavelengths; generating a plurality of downstream optical signals using each optical signal received and divided according to the wavelengths, in response to a plurality of electrical signals received from an external device; and combining the plurality of downstream optical signals with each other, and transmitting the result of the combining to a subscriber party through an optical line.

According to another aspect of the present invention, there is provided an Optical Line Terminal (OTL) using a wavelength agnostic light source, which is used in a Wavelength-Division-Multiplexed Passive Optical Network (WDM-PON), including: a protocol processing unit protocol-processing a downstream electrical signal that is to be transmitted to a subscriber party or a upstream electrical signal transmitted from the subscriber party; a downstream optical transmission unit generating a plurality of downstream optical signals in response to each downstream electrical signal output from the protocol processing unit, using a multi-wavelength optical signal or a broad-band optical signal, and combining the plurality of downstream optical signals with each other and generating a WDM downstream optical signal; a circulator transmitting the WDM downstream optical signal to a subscribe party through an optical line; and a upstream optical receiving unit receiving a WDM upstream optical signal transmitted from the subscriber party through the optical line, via the circulator, dividing the WDM upstream optical signal according to wavelengths, converting each optical signal into an electrical signal, and outputting the electrical signal to the protocol processing unit.

The present invention provides two embodiments of first and second embodiments, as follows.

The first embodiment proposes a structure in which a semiconductor optical amplifier which is a wavelength agnostic light source is used as an optical transmitter of a telephone office using a multi-wavelength light source (MWLS) module, and decides the wavelength interval of optical signals output from the MWLS module and a pass bandwidth of a wavelength demultiplexer (a wavelength splitter), in a Wavelength-Division-Multiplexed Passive Optical Network (WDM-PON) according to a downstream optical sign al reusing method.

The second embodiment proposes a structure in which a semiconductor optical amplifier which is a wavelength-agnostic light source is used as an optical transmitter in a telephone office using a broad-band light source (BLS) module, in a WDM-PON according to a downstream optical signal reusing method.

According to the present invention, a downstream optical transmission apparatus in a telephone office demultiplexes optical signals that are output from a MWSL module or a BLS module for each WDM channel, and injects the result of the demultiplexing to a RSOA. Then, the RSOA generates an optical signal with respect to each downstream electrical signal which is received from a protocol processor, wavelength-multiplexes the downstream optical signal generated for each WDM channel by a wavelength multiplexer (a wavelength combiner) in the telephone office, and transmits the result of the wavelength-multiplexing to a subscriber party.

According to another aspect of the present invention, there is provided a wavelength-Division-Multiplexed Passive Optical Network (WDM-PON) system including: a seed light generator generating a seed light whose wavelength interval and central wavelength are adjusted, using at least one seed light source; an optical line terminal (OLT) receiving the seed light from the seed light generator, transmitting a downstream optical signal to a subscriber of the WDM-PON, and receiving a upstream optical signal transmitted from the subscriber; an optical network unit (ONU) transmitting a upstream optical signal to which the downstream optical signal received from the OLT is modulated so that the downstream optical signal includes upstream data.

The WDM-PON system further includes a wavelength multiplexing/demultiplexing unit dividing the downstream optical signal transmitted from the OLT according to wavelengths, and wavelength-multiplexing the upstream optical signal transmitted from the ONU.

The OLT and the wavelength multiplexing/demultiplexing unit are connected through a single optical fiber to each other.

The seed light generator includes: at least one seed light source generating a seed light having a predetermined wavelength; an optical coupler collecting and re-distributing the seed light generated by the at least one seed light source; an optical amplifier amplifying an optical signal output from the optical coupler; and an optical power splitter splitting the amplified optical signal and transmitting the splitted optical signal to the OLT.

The OLT includes: an OLT protocol processor performing protocol-processing on downstream data that is to be transmitted to the subscriber party and upstream data transmitted from the subscriber party, a downstream optical transmitter transmitting a downstream optical signal including the downstream data generated by modulating the seed light, to the subscriber party; and a upstream optical receiver receiving a upstream optical signal including upstream data which the subscriber party wants to transmit.

The downstream optical transmitter includes: a downstream optical signal modulator modulating the seed light so that the seed light includes the downstream data; a downstream optical signal multiplexer multiplexing the downstream optical signal transmitted from the downstream optical signal modulator; a circulator separating the seed light signal from the downstream optical signal transmitted from the downstream optical signal multiplexer; and a downstream optical signal amplifier amplifying the downstream optical signal transmitted from the circulator so that the downstream optical signal is transmitted to the ONU.

The upstream optical receiver includes: a upstream optical signal amplifier amplifying the upstream optical signal to compensate for transmission loss of the upstream optical signal; a upstream optical signal demultiplexer dividing the upstream optical signal transmitted from the upstream optical signal amplifier according to wavelengths; and a upstream optical signal demodulator demodulating the upstream optical signal to extract the upstream data included in the upstream optical signal transmitted from the upstream optical signal demultiplexer.

The WDM-PON system further includes: a monitoring optical signal transmitter transmitting a monitoring optical signal; a monitoring optical signal receiver receiving the monitoring optical signal after the monitoring optical signal passes through a passive optical network; a link monitoring controller controlling optical signal transmission of the monitoring optical signal transmitter and optical signal reception of the monitoring optical signal receiver, and determining whether an optical fiber connecting the OLT to the ONU is cut off and whether the upstream optical signal is transmitted from the ONU, on the basis of the monitoring optical signal; a first coupler transmitting the monitoring optical signal to the optical fiber so that the monitoring optical is transmitted in a downstream direction; and a second coupler dividing the monitoring optical signal after the monitoring optical signal passes through the passive optical network, from the optical fiber, to receive the monitoring optical signal from the optical fiber.

The monitoring optical signal transmitter includes: a first frequency converter receiving a monitoring electrical signal from the link monitoring controller, and converting a frequency of the monitoring electrical signal using an RF carrier located in a frequency region which is distant from a baseband; and a monitoring light source unit modulating the monitoring optical signal, using the monitoring electrical signal whose frequency has been converted, and generating a modulated optical signal.

The monitoring light source unit includes: an optical switch unit receiving the seed light and outputting an optical signal having a specific wavelength; and an reflective semiconductor optical amplifier (RSOA) modulating the optical signal received from the optical switch unit, using the monitoring electrical signal received from the first frequency converter and the monitoring electrical signal received from the link monitoring controller.

The monitoring light source unit includes: an optical signal multiplexing/demultiplexing unit receiving the seed light, dividing the seed light according to wavelengths, and outputting an optical signal; and a Reflective Semiconductor Optical Amplifier (RSOA) array unit modulating the optical signal received from the optical signal multiplexing/demultiplexing unit, using the monitoring electrical signal received from the first frequency converter and the monitoring electrical signal received from the link monitoring controller.

The monitoring optical signal receiver includes: an optical signal converter receiving the monitoring optical signal after the monitoring optical signal passes through the PON, and converting the monitoring optical signal into an electrical signal; and a second frequency converter converting a frequency of an electrical signal received from the optical signal converter into a baseband.

The seed light source includes: an optical amplifier generating an optical signal; an optical reflective unit reflecting the optical signal by varying a reflective ratio and an optical attenuation ratio of the optical signal; an optical signal multiplexing/demultiplexing unit receiving the optical signal generated by the optical amplifier, dividing the optical signal according to wavelengths, and transmitting the divided optical signal to the optical reflective unit; an optical coupler receiving the optical signal reflected by the optical reflective unit, transmitting some of the optical signal to the outside, and transmitting the remaining part of the optical signal to the optical amplifier; and a circulator transmitting the optical signal generated by the optical amplifier to the optical signal multiplexing/demultiplexing unit, and transmitting the optical signal reflected by the optical reflective unit to the optical coupler.

The OLT and the wavelength multiplexing/demultiplexing unit are connected to each other in such a manner that upstream transmission and downstream transmission are respectively performed through separate optical fibers.

The ONU includes: an ONU protocol processor performing protocol-processing on downstream data that is to be transmitted to the subscriber party and upstream data transmitted from the subscriber party; a upstream optical transmitter flattening and optical-amplifying the downstream optical signal, to thus convert the downstream optical signal into a upstream light, modulating the upstream light to a upstream optical signal including upstream data which the subscriber party wants to transmit, and then transmitting the upstream optical signal; a downstream optical receiver receiving the downstream optical signal including the downstream data and extracting the downstream data; and an optical coupler dividing the downstream optical signal, and transmitting the divided downstream optical signal to the upstream optical transmitter and the downstream optical receiver.

The optical transmitter includes: an optical coupler splitting the downstream optical signal into a first signal and a second signal and outputting the first signal and the second signal; an optical diode converting the first signal to a current signal; a transimpedance amplifier amplifying the current signal transmitted from the optical diode and converting the amplified current signal into a voltage signal; a limiting amplifier re-amplifying the voltage signal transmitted from the transimpedance amplifier; a first delay unit adjusting a phase of the voltage signal output from or inverted by the limiting amplifier so that the second signal is optimally flattened; an AND gate passing the output signal of the first delay unit therethrough when the upstream data has a level '1', and preventing the output signal of the first delay unit from passing therethrough when the upstream data has a level '0'; a second delay unit adjusting a phase of the output signal output from the AND gate and a phase of the upstream optical signal in such a manner that the phase of the output signal output from the AND gate is equal to the phase of the upstream optical signal; a first LD driver modulating the output signal output from the AND gate, to a modulated signal; a second LD driver modulating the output signal output from the second delay unit, to a modulated signal; and a Reflective Semiconductor Optical Amplifier (RSOA) flattening the second signal using the modulated signal output from the first LD driver, and modulating the second signal to a upstream optical signal when the second signal is reflected from a reflective facet, using the modulated signal output from the second LD driver.

The WDM-PON system further includes: a first circulator distributing the second signal to the RSOA, receiving the flattened signal from the RSOA, and dividing the flattened signal to the outside, an external modulator receiving the flattened signal from the first circulator, and modulating the flattened signal to a upstream optical signal using a signal output from the second LD driver; and a second circulator receiving the upstream optical signal from the external modulator, and transmitting the upstream optical signal in a upstream direction, wherein the RSOA flattens the second signal using the signal output from the first LD driver.

The RSOA includes two active regions having a rear region for flattening the second signal using a signal received from the first LD driver and a front region for passing the second signal through the rear region and reflecting the second signal from a reflective facet, and modulating the reflected second signal to the upstream optical signal using a signal received from the second LD driver.

The optical transmitter includes: an optical coupler dividing the downstream optical signal to a first signal and a second signal and outputting the first signal and the second signal; an optical diode converting the first signal into a current signal; a transimpedance amplifier amplifying the current signal transmitted from the optical diode and converting the amplified current signal into a voltage signal; a limiting amplifier re-amplifying the voltage signal transmitted from the transimpedance amplifier; a first delay unit adjusting the phase of the voltage signal output from or inverted by the limiting amplifier so that the second signal is optimally flattened; an AND gate passing an output signal of the first delay unit therethrough when the upstream data has a level '1', and preventing the output signal of the first delay unit from passing therethrough when the upstream data has a level '0'; a second delay unit adjusting the phase of a signal output from the AND gate and the phase of the upstream optical signal so that the phase of the signal output from the AND gate is equal to the phase of the upstream optical signal; a first LD driver converting a signal output from the AND gate to a modulated signal; a second LD driver unit converting a signal output from the second delay unit into a modulated signal; a semiconductor optical amplifier (SOA) flattening the second signal using a combination signal of the signal output from the first LD driver and the signal output from the second LD driver, and modulating the flattened signal to the upstream optical signal; and a circulator dividing the upstream optical signal so that the upstream optical signal is transmitted in a upstream direction.

The WDM-PON system further includes an external modulator receiving the second signal flattened by the SOA and modulating the second signal to a upstream optical signal using the signal output from the second LD driver, wherein the SOA flattens the second signal using the signal output from the first LD driver.

The SOA includes two active regions having a front region for flattening the second signal using the signal output from the first LD driver and a rear region for modulating the second signal flattened by the front region to the upstream optical signal using the signal output from the second LD driver.

The SOA includes three active regions having a front region for flattening the second signal using the signal output from the first LD driver, an intermediate region for optically amplifying the second flattened by the front region, and a rear region for modulating the second signal optically amplified by the intermediate region to the upstream optical signal.

The optical transmitter includes: an optical coupler dividing the downstream optical signal to a first signal and a second signal, and outputting the first signal and the second signal; an optical diode part converting the first signal into a current signal; a transimpedance amplifier amplifying the current signal transmitted from the optical diode, and converting the amplified current signal into a voltage signal; a limiting amplifier re-amplifying the voltage signal transmitted by the transimpedance amplifier; a delay unit adjusting the phase of the voltage signal output from or inverted by the limiting amplifier so that the second signal is optimally flattened; an RF amplifier adjusting the signal transmitted by the delay unit so that the size of the second signal is optimally flattened; a LD driver converting the upstream data signal to a modulated signal; a RSOA flattening the second signal using the signal output form the RF amplifier, and modulating the flattened second signal to a upstream optical signal using the signal output from the LD driver when the second signal is reflected from a reflective facet.

The delay unit adjusts the phase of the voltage signal output from or inverted by the transimpedance amplifier, without passing through the limiting amplifier, so that the second signal is optimally flattened.

MODE OF THE INVENTION

Hereinafter, preferred embodiments of present invention will be described in detail with reference to the attached drawings.

FIG. 1 is a conceptual diagram of a Wavelength-Division-Multiplexed Passive Optical Network (WDM-PON) based on a Reflective Semiconductor Optical Amplifier (RSOA) that reuses optical signals. Referring to FIG. 1, the WDM-PON includes a central office (CO) 101, an optical fiber line 102, a remote node (RN) 103, and a plurality of optical network terminals (ONTs) 104.

The central office 101 includes an optical source unit for transmitting downstream data, a receiver for receiving upstream data, and an optical multiplexing/demultiplexing unit (MUX/DMUX) for multiplexing/demultiplexing optical wavelengths.

The remote node 103 includes an optical multiplexing/demultiplexing unit (MUX/DMUX) comprised of a single arrayed waveguide grating (AWG) or a thin film filter (TFF). If multiplexed downstream optical signals are received to the optical multiplexing/demultiplexing unit of the remote node RN 103, the downstream optical signals are divided according to their wavelengths, and transmitted to the ONTs 104 through an optical fiber line.

Each ONT 104 includes an RSOA, an optical receiver, and a coupler. The elements can be arranged individually or can be integrated into a single substrate. The coupler distributes downstream optical power of the downstream optical signal which is received through the optical fiber line, to the RSOA and to the optical receiver considering an optical power budget and a gain saturation of the downstream optical power. The optical receiver receives the corresponding downstream optical signal $D_i$ (where i=1~N), and the RSOA remodulates the corresponding input downstream optical signal $D_i$ to an upstream optical signal $U_i$ (where i=1~N) and transmits the remodulated upstream optical signal $U_i$ to the central office 101 (via the remote controller 103?).

The upstream optical signal $U_i$ is multiplexed by the optical multiplexing/demultiplexing unit of the remote node 103 and then transmitted to the central office 101 through the optical fiber line 102. The upstream optical signal $U_i$ input to the central office 101 is demultiplexed by the optical multiplexing/demultiplexing unit in the central office 101 and then transmitted to the optical receiver for each channel (or for each wavelength). The optical receiver finally receives an upstream optical signal $U_N$.

Figure 2:
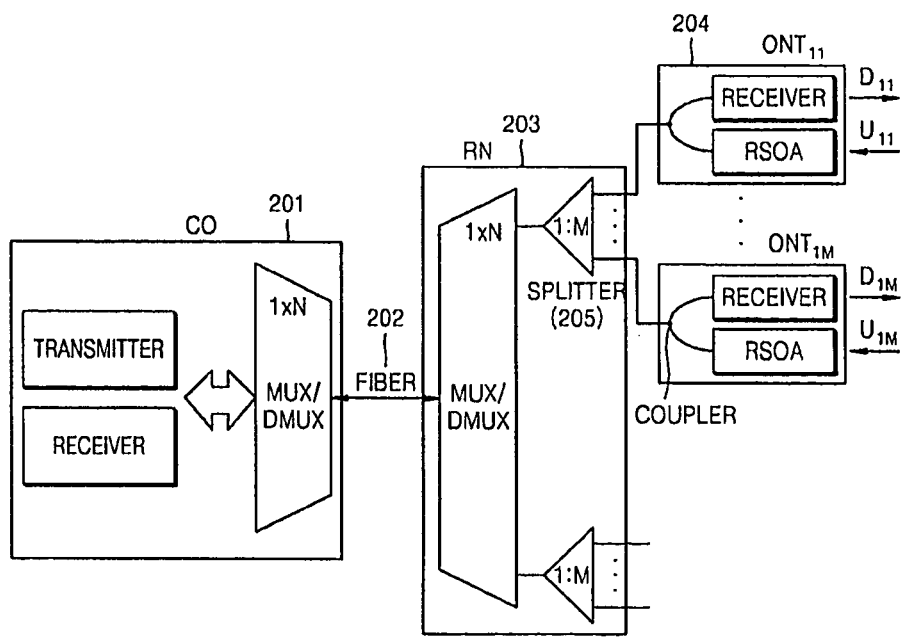
FIG. 2 is a conceptual diagram of a WDM-PON-time division multiplexing (TDM) based on a RSOA that reuses an optical signal.

FIG. 2 is a conceptual diagram of a WDM-PON-Time Division Multiplexing (TDM) system based on an RSOA that reuses optical signals. Referring to FIG. 2, the WDM-PON-TDM system includes a central office (CO) 201, an optical fiber line 202, a remote node (RN) 203, and a plurality of optical network terminals (ONTs) 204, wherein the remote node 203 includes a splitter 205. The elements 201 through 204 have the same roles and functions as the elements 101 through 104 illustrated in FIG. 1.

A split ratio of 1:M of the splitter 205 is determined considering a power budget of an overall optical link and a gain saturation of an RSOA for input power. If downstream optical signals are received an optical multiplexing/demultiplexing unit, the downstream optical signals are divided according to wavelengths by the optical multiplexing/demultiplexing unit and each downstream optical signal is transmitted according to its wavelength to M subscribers through the splitter 205. That is, if a wavelength multiplexing ratio is 1:N, the total number of subscribers that can be accommodated is hugely increased to N×M. Each downstream optical signal, which is transmitted through the splitter 205 and the optical fiber line 202, is input to the RSOA and the optical receiver through a coupler. The downstream optical signal input to the RSOA is remodulated to an upstream optical signal, and the optical receiver restores the downstream optical signal. The downstream optical signal input to the optical receiver includes information that is to be transmitted to a plurality of subscribers and has been multiplexed using a time division method, and the optical receiver extracts only its relevant information from the information. The upstream optical signal is transmitted during its assigned time slot to the central office 201 through the RSOA, in such a manner that the upstream optical signal does not collide with upstream optical signals transmitted from the remaining (M−1) subscribers. Upstream optical signals which are output from RSOAs and transmitted through a maximum of M subscriber channels using TDM, are combined by the splitter 205 of the remote node 203, then wavelength-multiplexed by the optical multiplexing/demultiplexing unit, and then input to an optical receiver of the central office 201 according to wave lengths. Here, the optical receiver is a burst mode optical receiver and needs to have an enough dynamic range to compensate for an optical power difference between the upstream optical signals of the M subscribers that are connected to the splitter 205.

Figure 3:
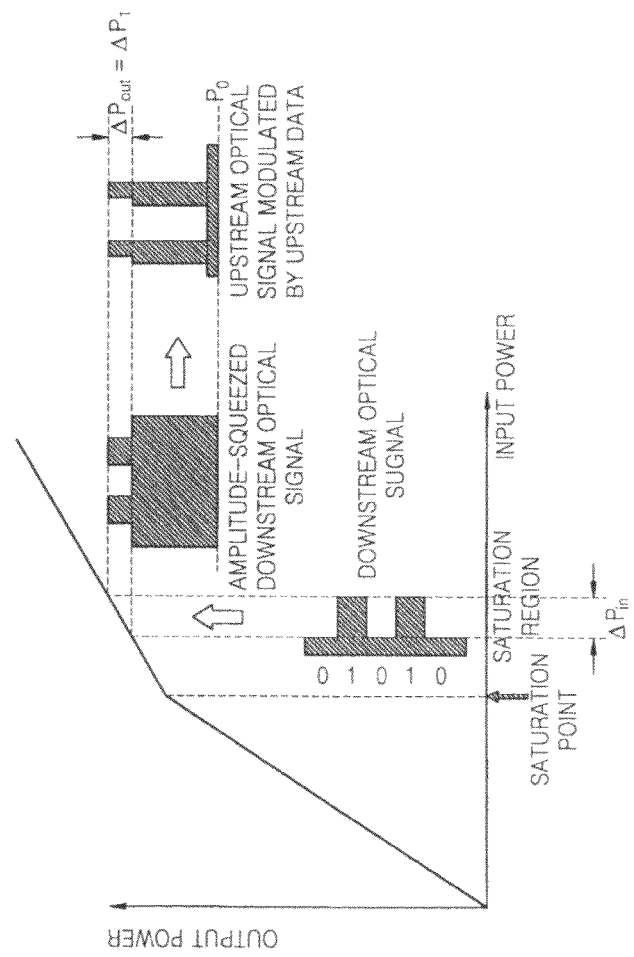
FIG. 3 is a view for explaining flattening by an optical signal compression effect based on gain saturation of a RSOA.

FIG. 3 is a view for explaining flattening by an optical signal compression effect based on gain saturation of a RSOA. When a downstream optical signal is input to a region where a gain is saturated (that is, when an input optical power is larger than an optical power at which a gain is saturated), the gain is not sufficiently effected at level '1' since the gain has been saturated at the level '1' while the gain is relatively greatly effected at a level '0'. As a result, a difference ΔPin between the level '1' and the level '0' of the downstream optical signal is reduced to ΔPout, that is, ΔPin>ΔPout. The phenomenon is called an amplitude squeezing effect. However, a downstream optical signal, which is not squeezed perfectly, has a residual amplitude of ΔPout, and if the downstream optical signal is modulated directly to upstream data at this state, the level '1' of the upstream optical signal becomes thicker, that is, ΔPin→ΔP1. The quality of upstream transmission gets worse, as the level '1' is thicker. Especially, if the thickness of the level '1' is more than a certain value, the quality of upstream transmission gets worse rapidly and accordingly power penalty increases rapidly. Hence, it is needed to greatly decrease the extinction ratio of the downstream optical signal. However, if the extinction ratio of the downstream optical signal is small, the extinction ratio decreases rapidly and transmission quality gets worse rapidly when the optical wavelengths of apparatuses constructing a downstream link are even slightly misarranged.

Figure 4:
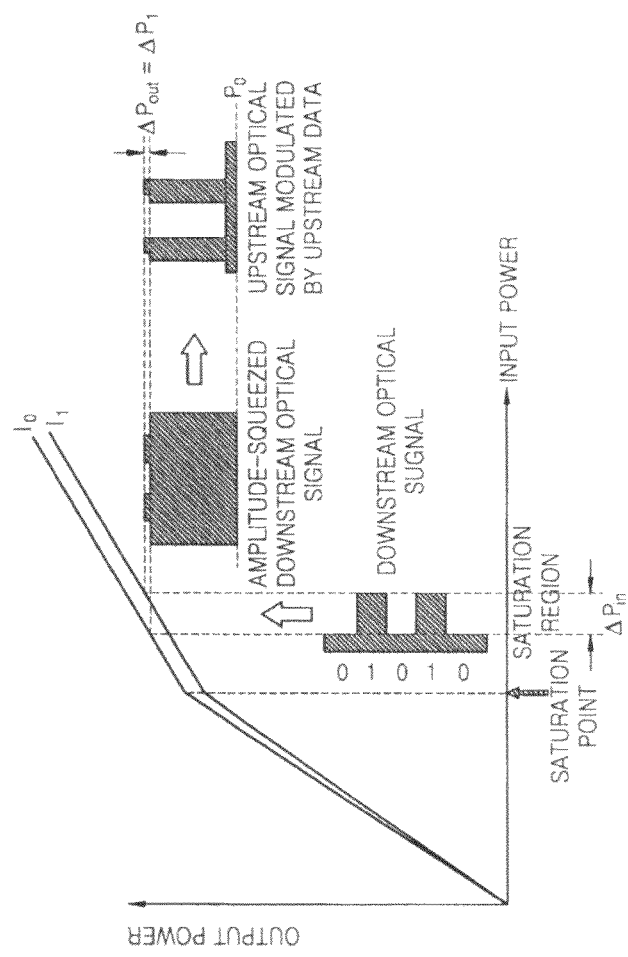
FIG. 4 is a view for explaining a phenomenon by which an input optical signal is flattened by Feed Forward Current Injection (FFCI) in a RSOA.

FIG. 4 illustrates that an optical signal is flattened by dynamically controlling injection of feed-forward current. During a level '1' period of an input optical signal, if the amount of current injection is reduced as compared to that in a level '0' period of the input optical signal, that is, if I1<I0, gain is reduced. Accordingly, a power difference between the level '1' and the level '0' of the input optical signal can be reduced. Therefore, flattening is possible at low input optical power regardless of the optical gain saturation characteristic of an RSOA and thus an optical power budget of an optical link is increased. Also, the extinction ratio of the downstream optical signal can be adjusted relatively high, so that the power penalty of the downstream transmission can be reduced. More over, a phenomenon, in which the extinction ratio is rapidly decreased and the transmission quality gets worse rapidly even when the optical wavelengths of apparatuses constructing a downstream link are slightly misarranged, can be alleviated. Furthermore, the quality of upstream transmission can be improved by reducing the thickness of the level '1' of the upstream optical signal.

Figure 5:
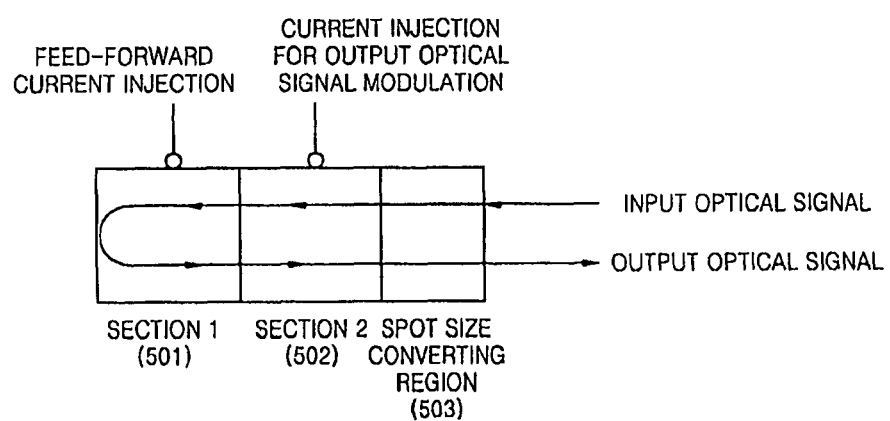
FIG. 5 illustrates the structure or an RSOA, in which an active region is divided in to two sections for flattening of an optical amplitude by dynamically controlling injection of feed-forward current, according to an embodiment of the present invention.

FIG. 5 illustrates the structure or an RSOA, in which an active region is divided in to two sections for flattening of an optical amplitude by dynamically controlling injection of feed-forward current, according to an embodiment of the present invention. Referring to FIG. 5, the RSOA includes a front region 502 (SECTION 2), a rear region 501 (SECTION 1), and a spot size converting (SCC) region 503 which can be included when necessary.

Current for modulating an upstream optical signal is injected into the front region 502. The front region 502 receives the modulation property of an input optical signal and provides current having polarity opposite to that of the input optical signal into the rear region 501. The carrier density and the optical power gain of the rear region 501 are changed according to the injected current so that the gain is reduced at the level '1' of the input optical signal and is increased at the level '0'. Accordingly, the extinction ratio of the input optical signal can be eventually reduced greatly.

Figure 6:
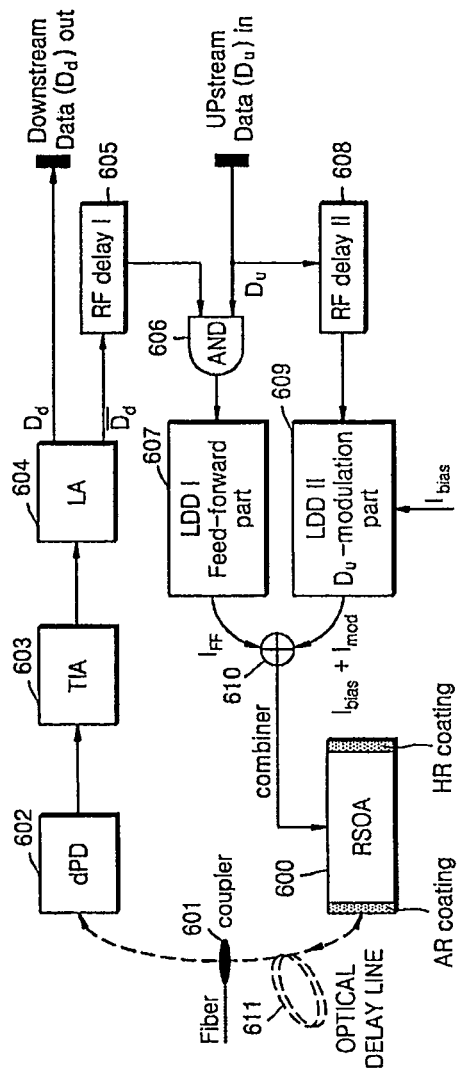
FIG. 6 illustrates a driving circuit for injecting feed-forward current into an RSOA including a single active region, according to a first embodiment of the present invention.

FIG. 6 illustrates a driving circuit for injecting a feed-forward current into an RSOA including a single active region, according to an embodiment of the present invention. Referring to FIG. 6, the driving circuit comprises an optical coupler 601, a data photo diode (dPD) 602, a transimpedance amplifier (TIA) 603, a limiting amplifier (LA) 604, a first RF delay 605, a second RF delay 608, an AND gate 606, a first LD driver (LDD I) 607, a second LD driver (LDD II) 609, a signal combiner 610, an RSOA 600, and an optical delay line 611.

A downstream optical signal transmitted from a telephone office is splitted by the optical coupler 601, in such a manner that a region of the downstream optical signal is input to the RSOA 600, and the other region of the downstream optical signal is input to the dPD 602. The downstream optical signal input to the dPD 602 is converted into a current signal and output, and then is amplified by the transimpedance amplifier 603 to be converted into a voltage signal. The transimpedance amplifier 603 transfers the voltage signal to the limiting amplifier 604. The limiting amplifier 604 reamplifies the voltage signal.

One of output terminals of the limiting amplifier 604 is connected to a downstream data signal processor, and the other of the output terminals is connected to the RF delay 605. The output signal of the RF delay 605 is transferred to the AND gate 605.

Meanwhile, some of input upstream data signals are input to the AND gate 606. The AND gate 606 passes the output signal of the first RF delay 605 therethrough when a received upstream data signal has a level '1', and prevents the output signal of the RF delay 605 from passing therethrough when the received upstream signal has a level '0'. The output signal of the AND gate 606 is converted into a current signal by the first LD driver 607 and then output.

The remaining part of the input upstream data signals is converted into a current signal by the second LD driver 609, and combined with bias current and then output. The output signal of the first LD driver 607 for supplying feed forward current and the output signal of the LDD 609 for supplying upstream data current are combined with each other by the signal combiner 610 and then injected to the RSOA 600.

In order to optimally flatten an optical signal input to the RSOA, the phase of the feed-forward signal and the phase of the downstream optical signal input to the RSOA 600 are adjusted to an optimal state by the first RF delay 605, while the phase of the up stream signal input to the AND gate and the phase of the upstream signal input to the RSOA 600 are adjusted to an optimal state by the second RF delay 608. Meanwhile, the optical delay line 611 acts to compensate for electrical delay by the RF delay 1605.

Figure 7:
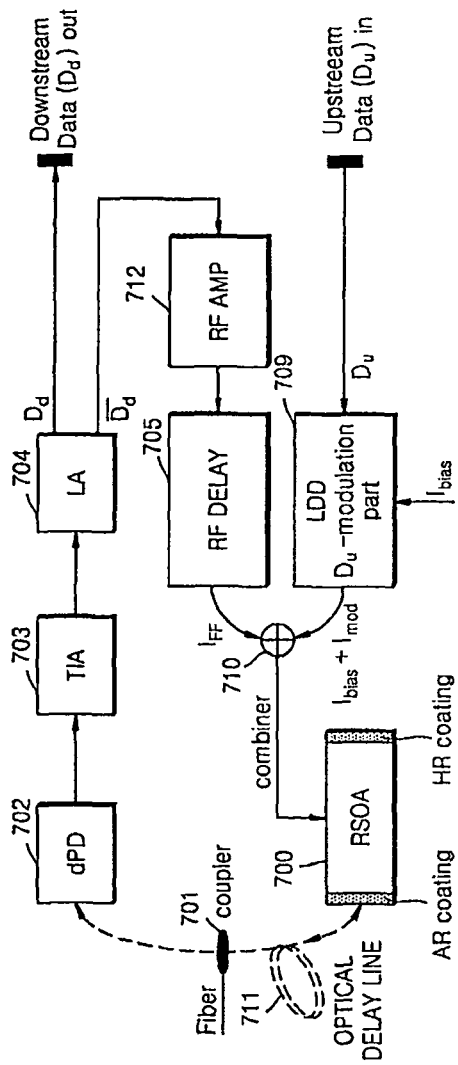
FIG. 7 illustrates a driving circuit for injecting feed-forward current into an RSOA, including a single active region, according to a second embodiment of the present invention.

FIG. 7 illustrates a driving circuit for injecting feed-forward current to a RSOA including a single active region, according to a second embodiment of the present invention. Referring to FIG. 7, the structure of the driving circuit is the same as the structure of the driving circuit illustrated in FIG. 6, except that a RF amplifier 712 is added in front of an RF delay 705 and the AND gate 606 is omitted, in order to adjust the sizes of signals output from a limiting amplifier 704 so that optimal flatness can be obtained.

The output signal of the RF delay 705 is combined with the output signal of a LD driver 709 in a signal combiner 710 and then input to the RSOA 700 in order to modulate it into upstream data. Accordingly, current input to the RSOA 700 has a format in which feed-forward current inverse-proportional to the strength of the modulated downstream optical signal overlaps the output current of the LD driver 709.

Figure 8:
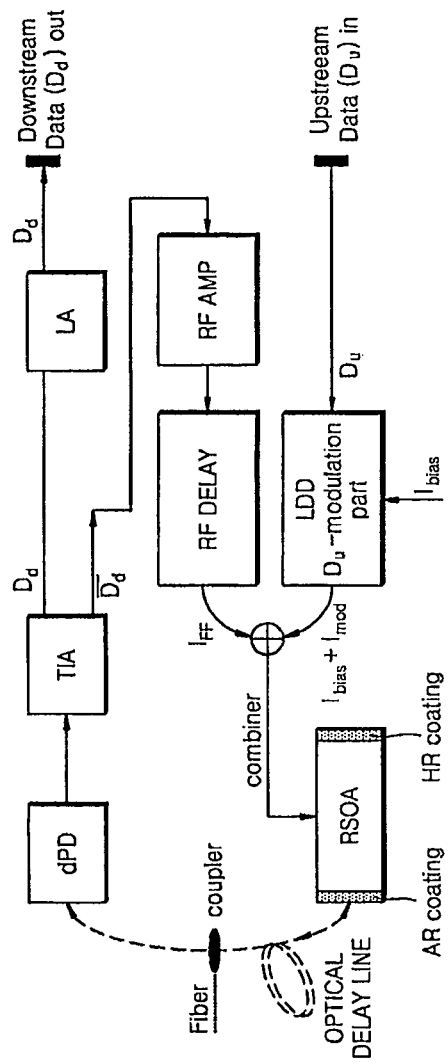
FIG. 8 illustrates a driving circuit for injecting feed-forward current into a RSOA including a single active region, according to a third embodiment of the present invention.

FIG. 8 illustrates a driving circuit for injecting a feed-forward current to a RSOA including a single active region, according to a third embodiment of the present invention. Referring to FIG. 8, the structure of the driving circuit is the same as the structure of the driving circuit illustrated in FIG. 7, except that one of output signals of a transimpedance amplifier 703 which is located in front of the limiting amplifier 704 is used as feed-forward current signal.

Figure 9:
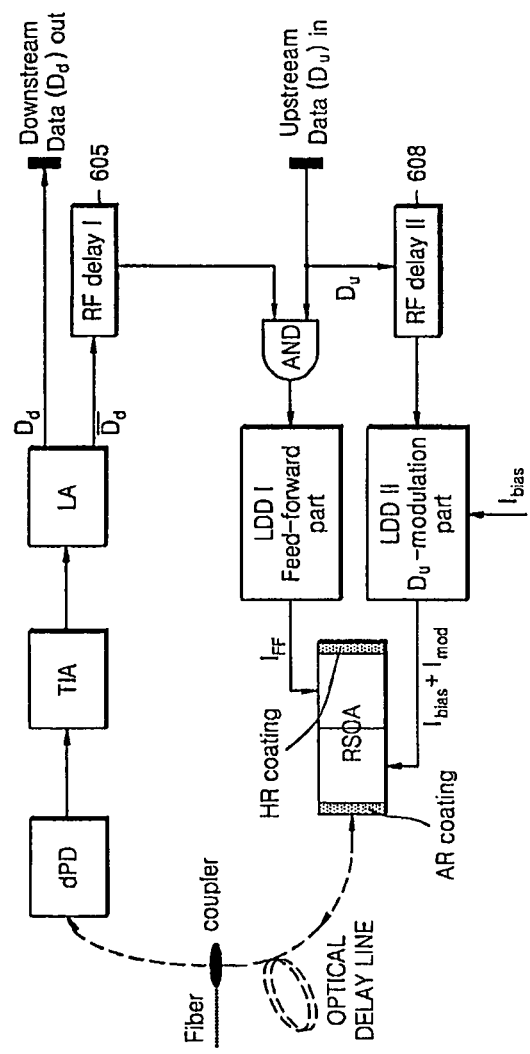
FIG. 9 illustrates a driving circuit for injecting feed-forward current into a RSOA, including a single active region, according to a first embodiment of the present invention.

FIG. 9 illustrates a driving circuit for injecting feed-forward current into an RSOA, including two active regions, according to a first embodiment of the present invention. The structure of the driving circuit illustrated in FIG. 9 has the same as the structure of the driving circuit illustrated in FIG. 6, except that the RSOA 600 of FIG. 6 has a single active region, while the RSOA of FIG. 8 has two active regions of a rear region and a front region, wherein the rear region is positioned at a side of the reflective facet and receives a signal having polarity opposite to that of the input optical signal, and the front region is positioned at a side opposite to the side of the rear region facing the reflective facet, passes the input optical signal to the rear region and modulates the input optical signal reflected from the reflection facet to an output optical signal.

Figure 10:
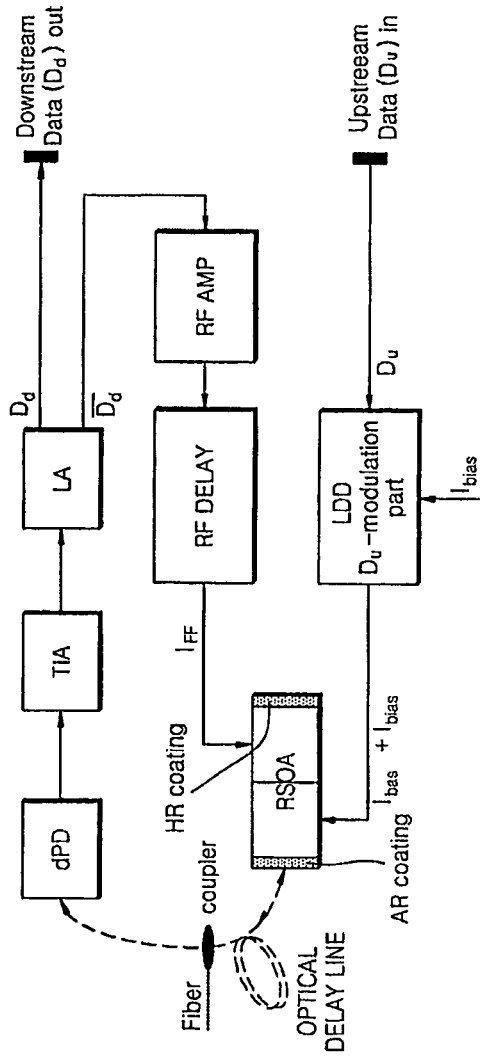
FIG. 10 illustrates a driving circuit for injecting feed-forward current into a RSOA, including two active regions, according to a second embodiment of the present invention.

FIG. 10 illustrates a driving circuit for injecting feed-forward current into a RSOA, including two active regions, according to a second embodiment of the present invention. The structure of the driving circuit illustrated in FIG. 10 is similar to the structure of the driving circuit illustrated in FIG. 7.

Figure 11:
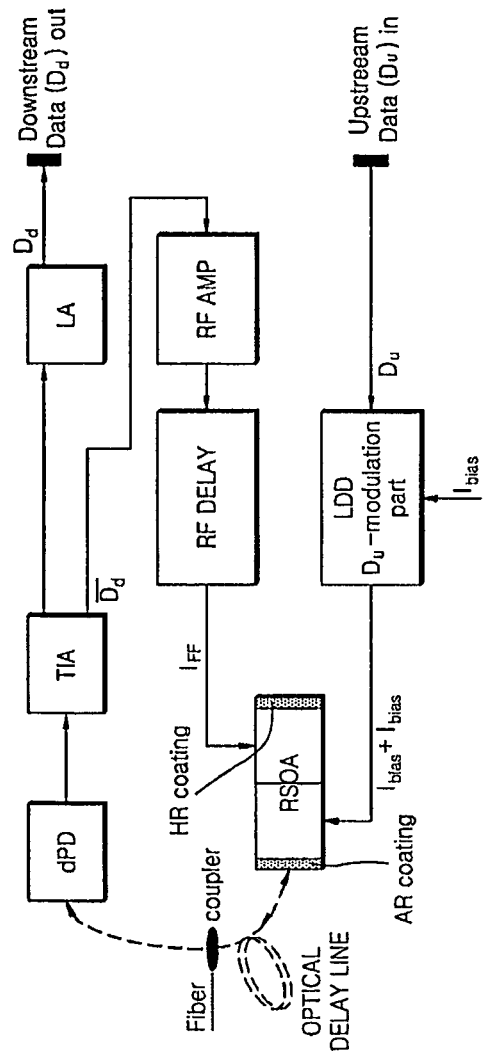
FIG. 11 illustrates a driving circuit for injecting feed-forward current into a RSOA including a single active region, according to a third embodiment of the present invention.

FIG. 11 is a driving circuit for injecting a feed-forward current to a RSOA including two active regions, according to a third embodiment of the present invention. The structure of the driving circuit illustrated in FIG. 11 is similar to the structure of the driving circuit illustrated in FIG. 8.

Figure 12:
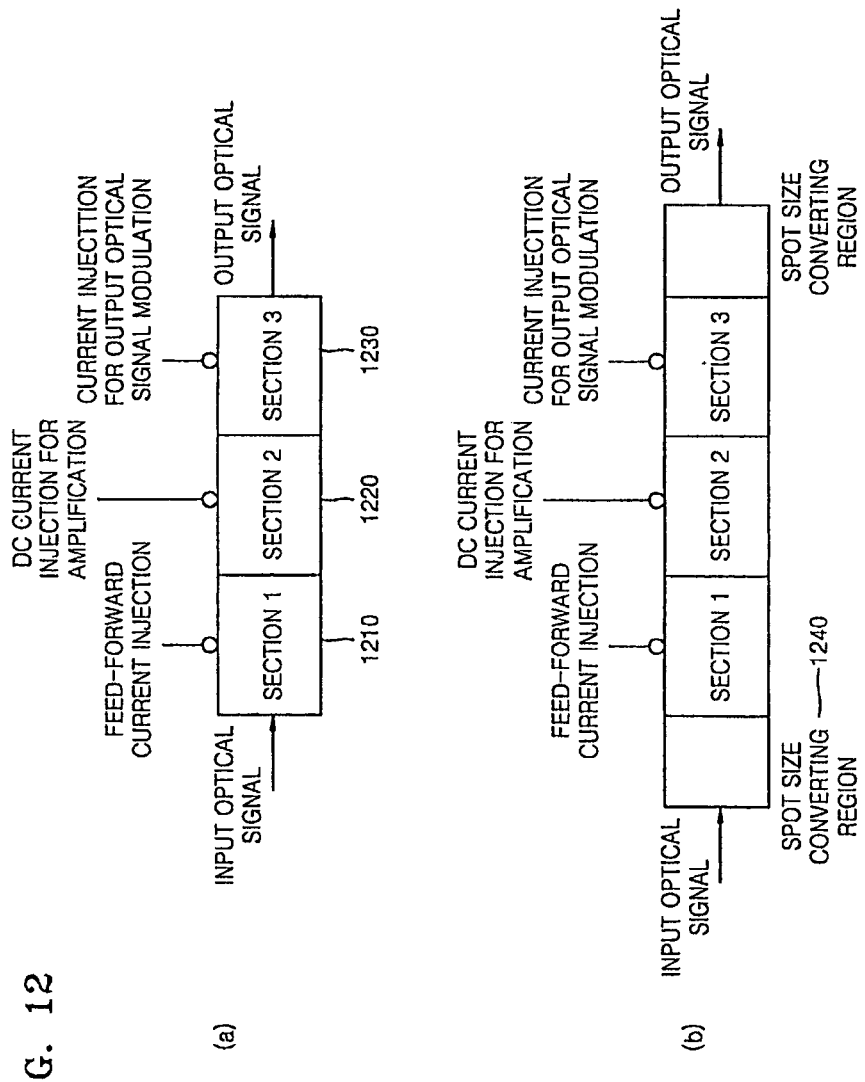
FIG. 12 illustrates the structure of a RSOA including three active regions to improve the flatness of an input optical signal, according to an embodiment of the present invention.

FIG. 12 is a view for explaining a SOA including three active regions in order to improve the flatness of an input optical signal, according to an embodiment of the present invention. Referring to FIG. 12, the SOA includes a front region 1210, an intermediate region 1220, a rear region 1230, and a SSC region 1240.

The SOA has a structure including the three active regions: the front region 1210 to which a downstream optical signal is input, the intermediate region 1220 for amplifying the downstream optical signal, and the rear region 1230 for modulating the downstream optical signal into an output optical signal. Current for modulating an upstream optical signal is injected to the rear region 1230. The intermediate region 1220 receives DC current and modulation characteristic of an input optical signal, and injects them with current having polarity opposite to that of the current for modulation to the front region 1210.

The carrier density and optical power gain of the front region 1210 depend on the injected current. If the input optical signal has a level '1', the front region 1210 decreases the gain, and if the input optical signal has a level '0', the front region 1210 increases the gain. Accordingly, the extinction ratio of the input optical signal can be significantly reduced.

The SSC region 1240 can be used to increase the combining effect between an optical fiber line and the SOA.

Figure 14:
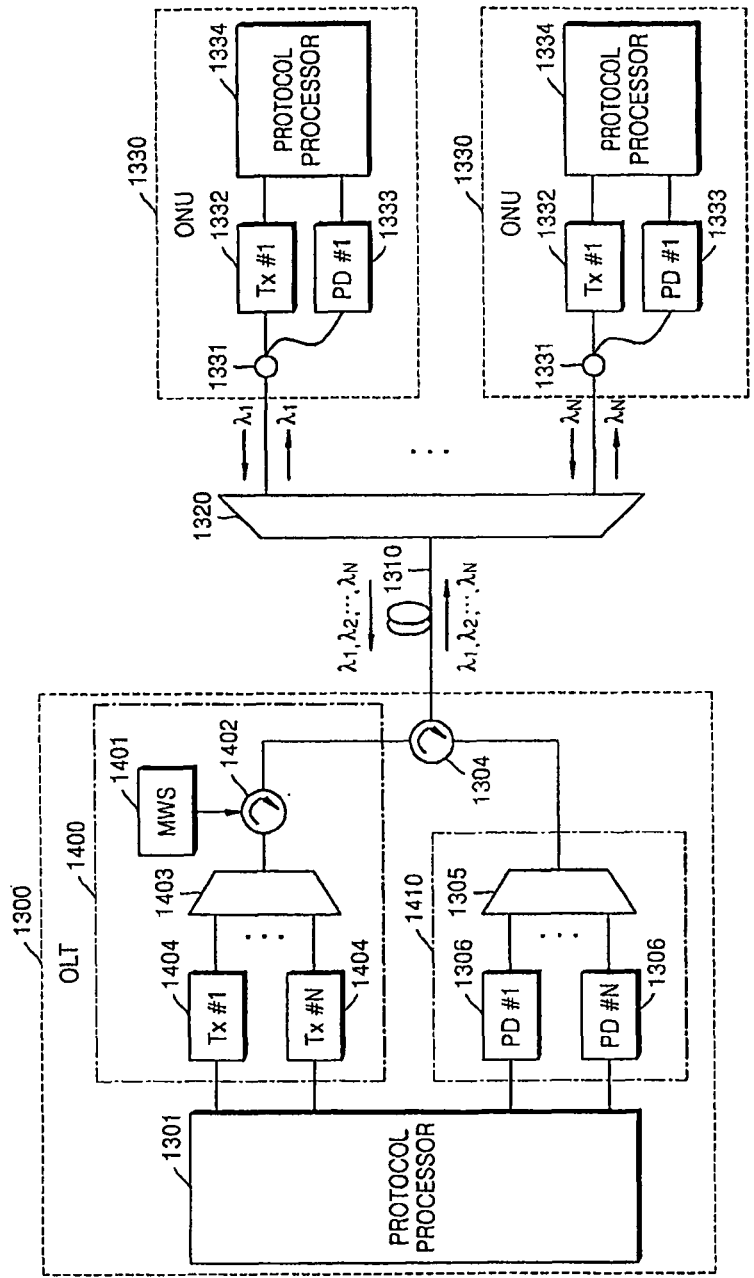
FIG. 14 illustrates an Optical Line Terminal (OLT) using a Multi-Wavelength Light Source (MWLS) module in a WDM-PON, according to an embodiment of the present invention.

FIG. 14 is a block diagram of an optical line terminal (OLT) 1300 using a multi-wavelength light source (MWLS) 1401 in a WDM-PON, according to an embodiment of the present invention. The OLT 1300 generates a downstream optical signal using the MWLS 1401.

The OLT 1300, as illustrated in FIG. 14, includes a protocol processor 1301, a downstream optical transmission unit 1400, an optical circulator 1304, and a upstream light receiving unit 1410. The respective elements will be described below.

Figure 13:
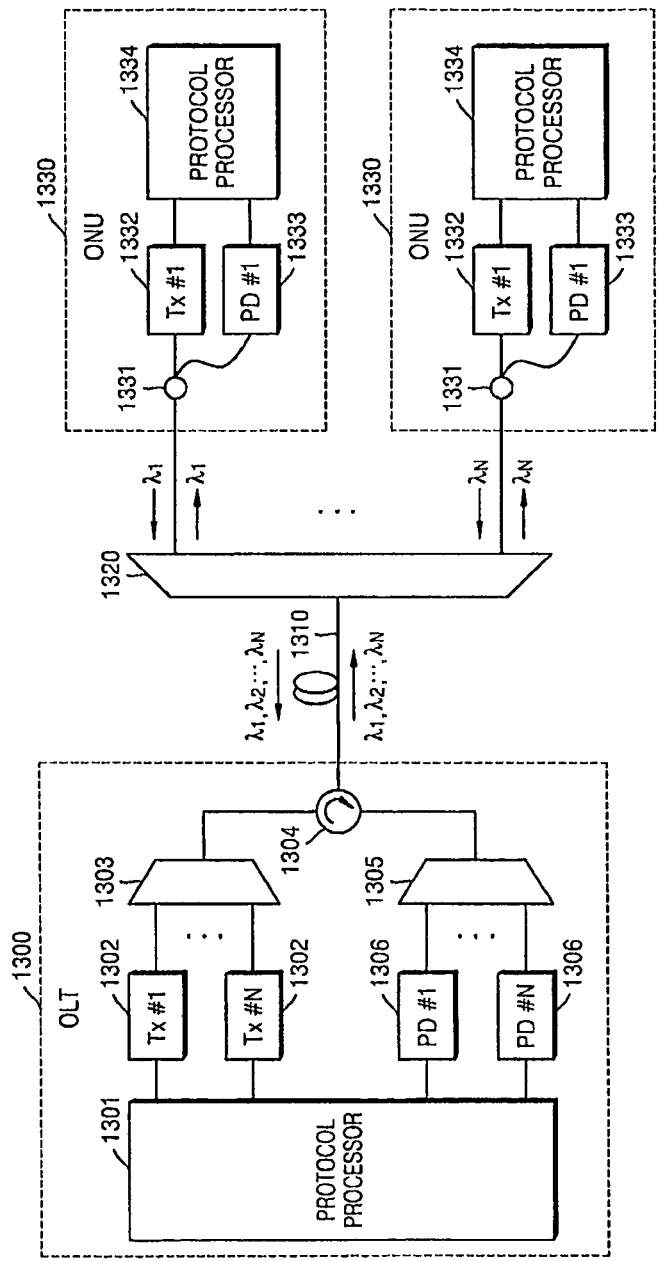
FIG. 13 is a configuration diagram of a WDM-PON according to a conventional downstream optical signal reusing method.

First, the protocol processor 1301 processes a downstream electrical signal that is to be transmitted to a subscriber party, or a upstream electrical signal that has been transmitted from the subscriber party, and performs the same function as the protocol processor illustrated in FIG. 13.

The downstream optical transmission unit 1400, as illustrated in FIG. 14, includes the multi-wavelength light source (MWLS) 1401, an optical circulator 1402, a wavelength multiplexing/demultiplexing unit 1403, and a plurality of optical transmitters 1404.

The OLT 1300 illustrated in FIG. 14 is implemented by adding the MWLS 1401 and the optical circulator 1402 to an OLT 1300 illustrated in FIG. 13 and using a wavelength agnostic semiconductor amplifier as the optical transmitter 1404. That is, the optical transmitter 1404 is the same wavelength agnostic semiconductor optical amplifier as in an optical transmitter 1332 of an ONU 1330, instead of a wavelength fixed type optical transmitter 1302 illustrated in FIG. 13.

The wavelength multiplexing/demultiplexing unit 1403 operates as a wavelength demultiplexer corresponding to a wavelength splitter when a multi-wavelength optical signal is received from the MWLS 1401 through the optical circulator 1402, and operates as a wavelength multiplexer when a multi-wavelength optical signal (ok?) is received from the optical transmitter 1404. A wavelength multiplexing/demultiplexing unit 1403 illustrated in FIG. 8 also operates in the same manner.

The operation of the OLT 1300 will be described below with reference to FIGS. 14 through 17.

If a multi-wavelength optical signal is output from the MWS module 1401, the optical circulator 1402 transfers the multi-wavelength optical signal to the wavelength multiplexing/demultiplexing unit 1403.

Figure 16:
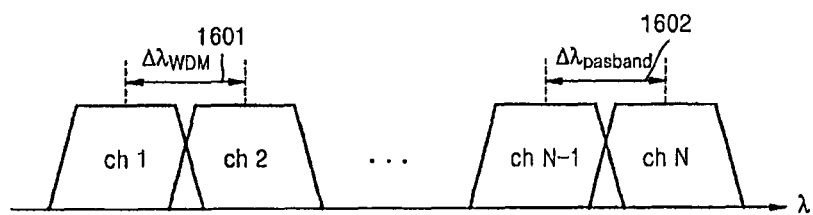

Then, the wavelength multiplexing/demultiplexing unit 1403 functions as a wavelength splitter as illustrated in FIG. 16. That is, the wavelength multiplexing/demultiplexing unit 1403 divides the multi-wavelength optical signal according to wavelengths, and outputs each optical signal to the corresponding optical transmitter 1404 (see FIG. 17).

Then, if each optical transmitter 1404 receives a downstream electrical signal from the protocol processor 1301, the optical transmitter 1404 generates and outputs a downstream optical signal using the downstream electrical signal.

The wavelength multiplexing/demultiplexing unit 1403 combines downstream optical signals output from the respective optical transmitters 1404 with each other, and generates a WDM downstream optical signal. That is, the wavelength multiplexing/demultiplexing unit 1403 functions as a wavelength multiplexer.

The WDM downstream optical signal which has been combined in this manner is transmitted to an ONU party through the optical circulator 1402 or 1304 corresponding to a branch unit.

A method of transmitting a down stream optical signal in the OLT as described above will be described in detail with reference to FIGS. 15, 16, and 17, below.

Meanwhile, the upstream light receiving unit 1410 of the OLT 1300 includes a wavelength demultiplexer 1305 and a plurality of optical receivers PD#1 through PD#N 1 306. The upstream light receiving unit 1410 divides a WDM upstream optical signal (transmitted form an ONU party) received through the optical circulator 1304, according to wavelengths, and converts each optical signal into an electrical signal and outputs the resultant electrical signal to the protocol processor 1301. That is, the function of the upstream light receiving unit 1410 has been described above with reference to FIG. 13.

Also, the ONU 1330 also has the same function as described above in FIG. 13, and therefore, a detailed description thereof will be omitted.

Figure 15:
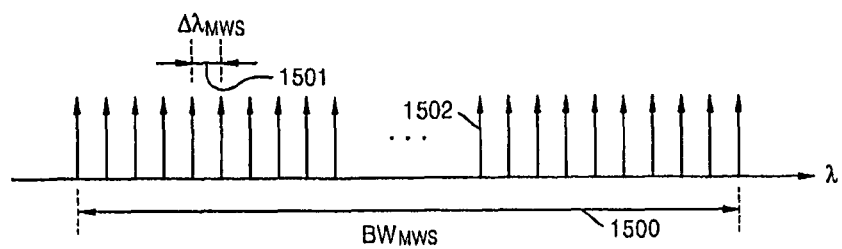
FIGS. 15, 16, and 17 are views showing an output spectrum of the MWLS, a pass band of a wavelength multiplexing/demultiplexing unit, and an output spectrum which has passed through the wavelength multiplexing/demultiplexing unit, in the structure illustrated in FIG. 14.
Figure 17:
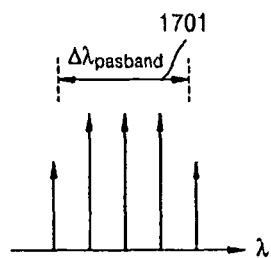

FIGS. 15, 16, and 17 are views for explaining an output spectrum of the MWLS 1401, a pass bandwidth of the wavelength multiplexing/demultiplexing unit 1403, and an output spectrum which has passed through the wavelength multiplexing/demultiplexing unit 1403, in the OLT 1300 illustrated in FIG. 14.

That is, FIG. 15 illustrates an output spectrum (a spectrum of a multi-wavelength optical signal) of the MWLS 1401, FIG. 16 illustrates a pass bandwidth of the wavelength multiplexing/demultiplexing unit 1403 corresponding to a wavelength splitter, and FIG. 17 illustrates an output spectrum for a specific channel which passes through the wavelength multiplexing/demultiplexing unit 1403 functioning as a wavelength divider.

An optical spectrum output from the MWLS module 1401 is output with a plurality of wavelengths, and the output optical powers of the wavelengths are uniform, wherein the output optical power of each wavelength is within 5 dBm.

A bandwidth range $BW_{MWS}$ 1500 of a multi-wavelength optical signal which is output from the MWLS module 1401 satisfies Equation 1, when the number of available channels is N and a channel interval is $\Delta\lambda_{WDM}$ 1501. That is, Equation 1 represents a relationship between $N \times \Delta\lambda_{WDM}$ and the bandwidth range $BW_{MWS}$ of the output optical signal of the MWLS 1401.

$$BW_{MWS} \leq N \times \Delta\lambda_{WDM}$$

Meanwhile, as illustrated in FIG. 16, the relationship between the WDM channel pass bandwidth $\Delta\lambda_{passband}$ 1602 of the wavelength multiplexing/demultiplexing unit 1 403 and the output wavelength interval $\Delta\lambda_{MWS}$ 1501 of the MWLS 1401 satisfies Equation 2.

$$\Delta\lambda_{MWS} \leq \Delta\lambda_{passband}$$

When Equations 1 and 2 are satisfied, after an output optical signal of the MWL S 1401 passes through the wavelength multiplexing/demultiplexing unit 1403, the resultant spectrum is shown in FIG. 17.

The spectrum which has passed through the wavelength multiplexing/demultiplexing unit 1403 includes an output wavelength of the MWLS 1401 which exists in the channel pass bandwidth $\Delta\lambda_{passband}$ 1701 of the wavelength multiplexing/demultiplexing unit 1403. That is, FIG. 17 illustrates the case where three output wavelengths of the MWLS module 1401 exist in the channel pass bandwidth $\Delta\lambda_{passband}$ 1701 of the wavelength multiplexing/demultiplexing unit 1403.

When several wavelengths exist in a WDM channel under the above condition, power penalty can occur in a WDM channel due to the distortion of a downstream optical signal caused by the divergence of an optical fiber line when a transmission distance is distant. Hence, when the wavelength multiplexing/demultiplexing unit 1403 has a wavelength interval of 200 GHz, it is preferable that the following Equation 3 is satisfied.

$$\Delta\lambda_{passband} \leq 1.2 \text{ nm}$$

At least one optical wavelength can exist within a pass band width range such as Equation 3. Here, it is preferable that two or more optical wavelengths exist within the pass band width range.

The MWSL 1401 can be configured with various structures. For example, the MWSL 1401 may be a structure including an erbium-doped fiber ring laser, a semiconductor ring laser, a DFB-LB array, and a wavelength multiplexer.

Figure 18:
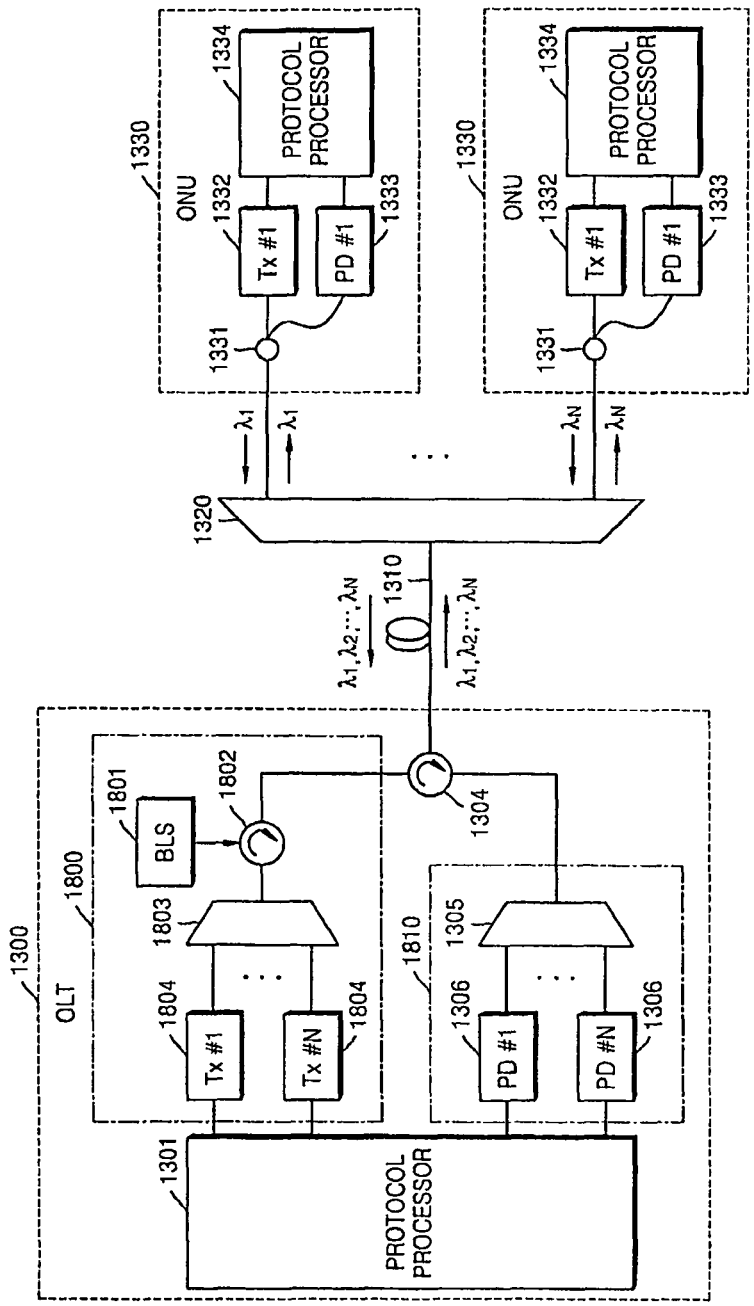
FIG. 18 illustrates an OLT using a Broad-band Light Source (BLS) module in a WDM-PON, according to an embodiment of the present invention.

FIG. 18 is a block diagram of an OLT using a BLS in a WDM-PON, according to an embodiment of the present invention.

The OLT 1300, as illustrated in FIG. 18, includes a protocol processor 1301, a downstream optical transmission unit 1800, an optical circulator 1304, and a upstream optical reception unit 1810, wherein the elements except for the downstream optical transmission unit 1800 are the same as the corresponding elements illustrated in FIG. 14.

Here, the downstream optical transmission unit 1800 is, as illustrated in FIG. 18, includes a broadband light source (BLS) 1801, an optical circulator 1802, a wavelength multiplexing/demultiplexing unit 1803, and a plurality of optical transmitters 1804. Here, each optical transmitter 1804 may be a wavelength agnostic semiconductor optical amplifier.

In summary, a main difference between the OLT 1300 illustrated in FIG. 18 and the OLT 1300 illustrated in FIG. 14 is that the MWLS 1401 is substituted by the BLS 1801. The remaining structure of the OLT 1300 illustrated in FIG. 18 is basically the same as the structure of the OLT 1300 illustrated in FIG. 14, and accordingly, a detailed description thereof will be omitted.

Figure 19:
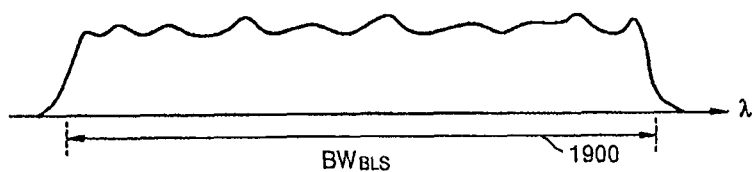
FIGS. 19, 20, and 21 are views showing an output spectrum of the BLS module, a pass band of a wavelength multiplexing/demultiplexing unit, and an output spectrum which has passed through the wavelength multiplexing/demultiplexing unit, in the structure illustrated in FIG. 18.
Figure 20:
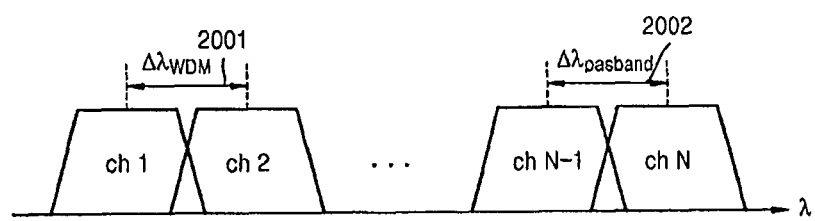
Figure 21:
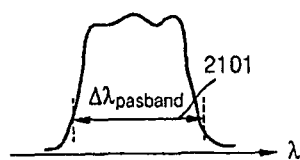

FIGS. 19, 20, and 21 are views for explaining an output spectrum of the BLS module 1801, a pass bandwidth of the wavelength multiplexing/demultiplexing unit 1803, and an output spectrum which has passed through the wavelength multiplexing/demultiplexing unit 1803, in the OLT 1300 illustrated in FIG. 18.

That is, FIG. 19 represents an output spectrum (a spectrum of a broad-band light signal) of the BLS 1801, FIG. 20 represents a pass bandwidth of the wavelength multiplexing/demultiplexing unit 1803 which functions as a wavelength splitter, and FIG. 21 represents an output spectrum for a specific channel which has passed through the wavelength multiplexing/demultiplexing unit 1803 which functions as a wavelength divider.

As illustrated in FIG. 19, an output bandwidth $BW_{BLS}$ 1900 of the BLS module 1801 has to satisfy Equation 4 when the number of available channels of a WDM-PON is N and a channel interval is $\Delta\lambda_{WDM}$ 2001.

$$BW_{BLS} \geq N \times \Delta\lambda_{WDM}$$

When Equation 4 is satisfied, a spectrum generated after the output optical signal of the BLS 1801 has passed through the wavelength multiplexing/demultiplexing unit 1803 is shown in FIG. 21, wherein the channel pass bandwidth $\Delta\lambda_{passband}$ is denoted by "2101".

The bandwidth of an optical signal which has passed through the wavelength splitter is determined by the channel pass bandwidth $\Delta\lambda_{passband}$ 2002 of the wavelength multiplexing/demultiplexing unit 1803, as illustrated in FIG. 20. In case of long-distance transmission, Equation 3 has to be satisfied in order to reduce penalty caused by the divergence of an optical fiber line.

The BLS 1801 can be configured with a variety of structures. For example, the BLS 1801 includes a semiconductor Superluminescent LED (SLD), an erbium-doped fiber amplifier Amplified Spontaneous Emission (ASE) light source, a semiconductor optical amplifier, ASE light source, etc.

Figure 22:
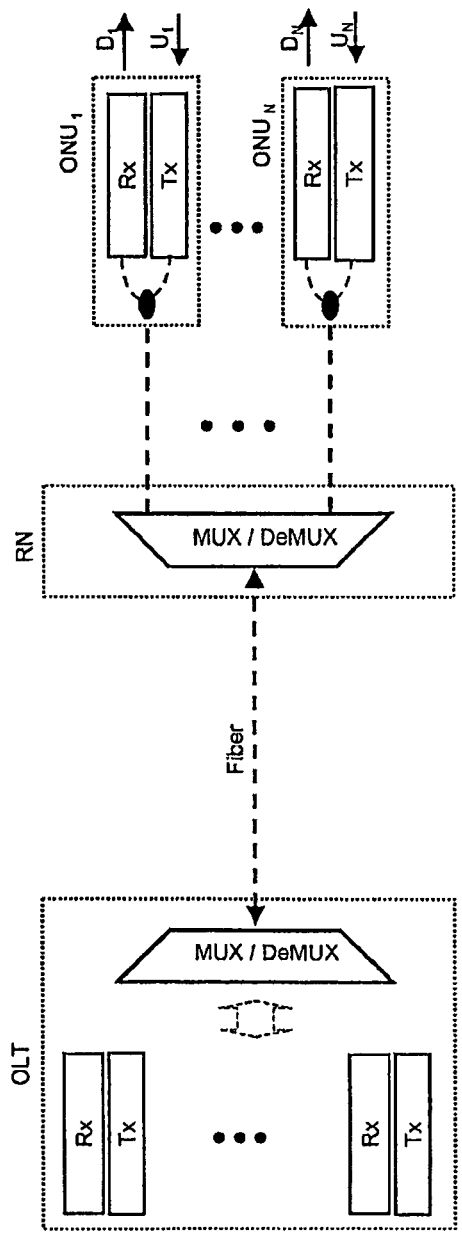
FIG. 22 is a configuration diagram of a conventional WDM-PON.

FIG. 22 is a configuration diagram illustrating a conventional WDM-PON. Referring to FIG. 22, the WDM-PON includes an OLT, an RN, and an ONU.

The OLT includes a plurality of receivers Rx, a plurality of transmitters Tx, a WDM multiplexer (MUX) for multiplexing a plurality of optical wavelengths, and a WDM demultiplexer (DeMUX) for demultiplexing a plurality of optical wavelengths.

The RN includes a WDM multiplexer (MUX) for multiplexing a plurality of optical wavelengths that are received from the ONU, and a WDM demultiplexer (DeMUX) for demultiplexing a plurality of optical wavelengths that are received from the OLT.

The ONU includes a plurality of receivers Rx for receiving downstream optical signals, a plurality of transmitters Tx for transmitting upstream optical signals, and a optical coupler for dividing an optical signal which is received from the RN, and sending some of the optical signals to the receivers Rx and the other part of the optical signals to the transmitters Tx.

Figure 23:
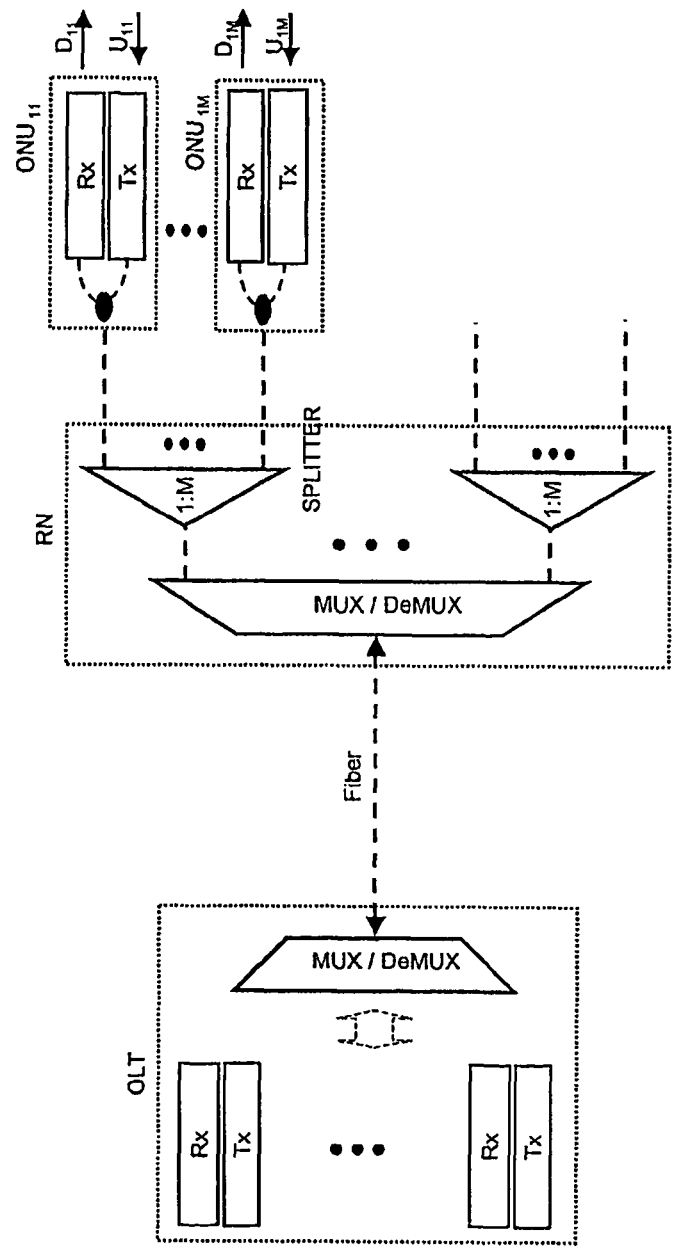
FIG. 23 is a configuration diagram of a conventional hybrid WDM-TDM-PON.

FIG. 23 is a configuration diagram illustrating a conventional WDM-TDM-PON. Referring to FIG. 23, the WDM-TDM-PON includes an OLT, an RN, and an ONU, like a WDM-PON.

The OLT includes a plurality of receivers Rx, a plurality of transmitters Tx, a WDM multiplexer (MUX) for multiplexing a plurality of optical wavelengths, and a WDM demultiplexer (DeMUX) for demultiplexing a plurality of optical wavelengths, like the WDM-PON.

A difference between the WDM-TDM-PON and the WDM-PON is that burst mode receivers are used in the WDM-TDM-PON because upstream optical packets that are received from ONUs have a burst characteristic by applying the TDMA method.

The RN further includes a WDM multiplexer (MUX) for multiplexing a plurality of optical wavelengths that are received from the ONUs, a WDM demultiplexer (DeMUX) for demultiplexing a plurality of optical wavelengths that are received from the OLT, and an optical power splitter for allowing a plurality of subscribers to share an optical wavelength.

The ONU includes a plurality of receivers Rx for receiving downstream optical signals, a plurality of transmitters Tx for transmitting upstream optical signals, and an optical coupler for dividing optical signals which are received from the RN, and sending a part of the optical signals to the receivers Rx and the other part of the optical signals to the transmitters Tx, as in the WDM-PON.

A difference between the WDM-TDM-PON and the WDM-PON is that burst mode transmitters are used in the WDM-TDM-PON because the ONU can transmit an optical signal only during a predetermined time.

Figure 24:
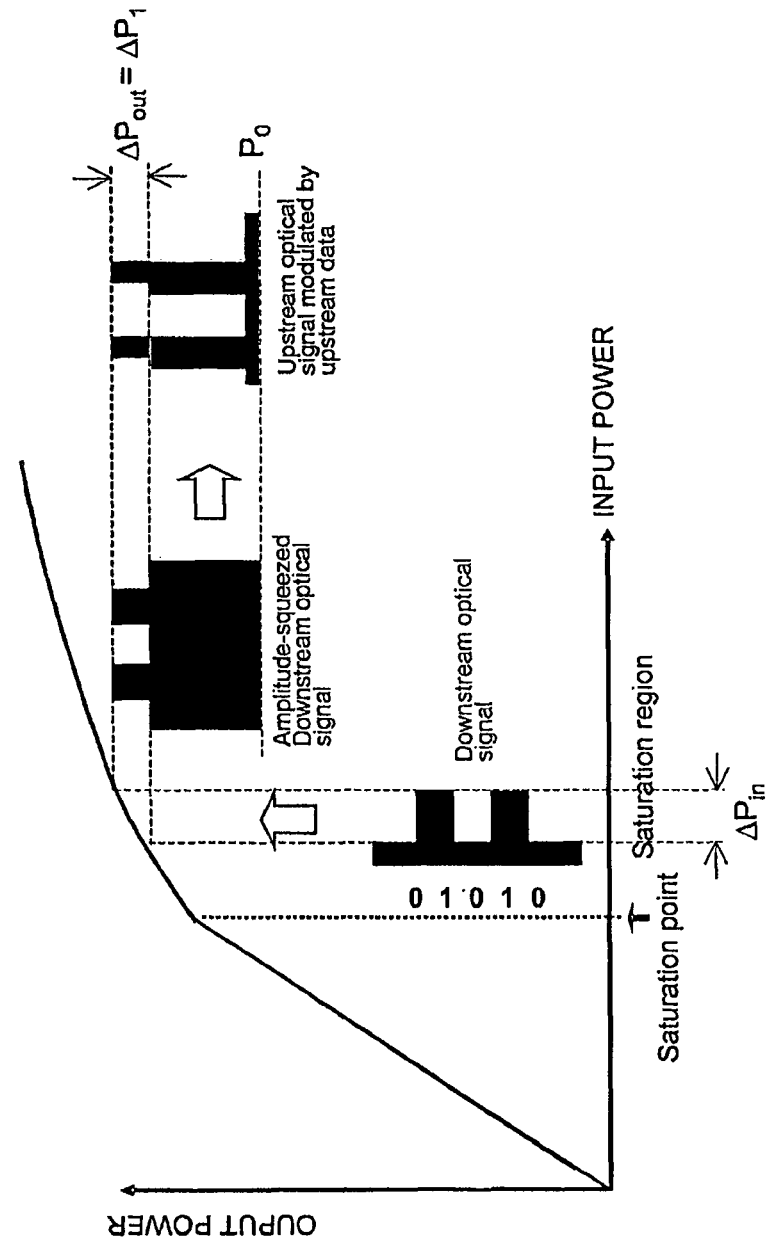
FIG. 24 is a view for explaining an input optical wavelength reusing phenomenon by a gain saturation characteristic of a RSOA or SOA (Semiconductor Optical Amplifier), according to an embodiment of the present invention.

FIG. 24 is a view for explaining an input optical wavelength reusing phenomenon utilizing a gain saturation characteristic of a RSOA or SOA, according to an embodiment of the present invention.

If a downstream optical signal is input to a gain saturated region (that is, if power of an input optical signal is greater than optical power at which the gain of a (R)SOA is saturated), a level '1' of the downstream optical signal cannot receive gain sufficiently in the gain saturated state, while a level '0' of the downstream optical signal receives relatively greater gain, a difference ΔPin(Extinction) between the level '1' and the level '0' of the downstream optical signal is reduced to ΔPout.

That is, ΔPin>ΔPout. This phenomenon is called an Amplitude Squeezing Effect. However, since an optical signal which has not been compressed completely has having a predetermined value of ΔPout when the optical signal is directly modulated to upstream data in this state, the ΔPout is reflected to the thickness ΔP1 of the level '1' of the modulated optical signal. The thicker the thickness ΔP1 of the level '1' becomes, the lower the quality of upstream transmission becomes. Particularly, if the thickness of the level '1' exceeds a predetermined thickness, the quality of upstream transmission sharply deteriorates, and power penalty increases. Accordingly, in order to avoid the problem, the extinction ratio of a downstream optical signal has to be significantly lowered.

Meanwhile, when the extinction ratio of the downstream optical signal is low, there appears sensitivity by which the extinction ratio is sharply reduced and thus transmission quality sharply deteriorates when optical wavelengths from apparatuses constructing a downstream link are even slightly misarranged, and accordingly the reliability of downstream transmission deteriorates.

Figure 25:
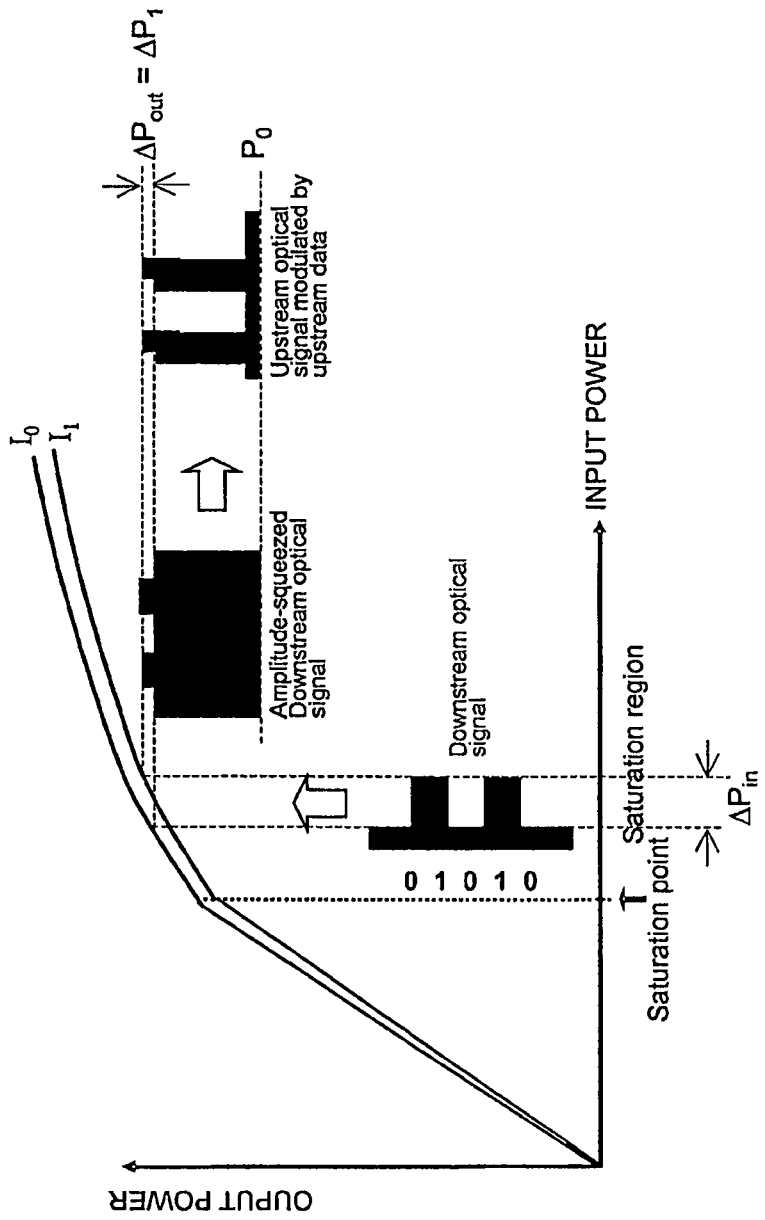
FIG. 25 is a view for explaining an input optical wavelength reusing phenomenon by injecting of feed-forward current in a RSOA or SOA, according to an embodiment of the present invention.

FIG. 25 is a view for explaining an input optical wavelength reusing phenomenon by feed-forward current in a (R)SOA, according to an embodiment of the present invention.

While the input optical signal has a level '1', gain is reduced during the period of the level '1' by reducing the amount of current that is injected, compared to when the input optical signal has a level '0'. Accordingly, a power difference (ER) between the level '1' and the level '0' of the input optical signal can be flattened.

Accordingly, since an input optical wavelength can be reused even at low input optical power at which no gain saturation occurs, an optical power budget of an optical link increases, the extinction ratio of a downstream optical signal can be adjusted to a relatively high value, and thus power penalty of downstream transmission can be reduced.

Also, it is possible to alleviate a phenomenon by which the extinction ratio is sharply reduced and thus transmission quality sharply deteriorates when optical wavelengths from apparatuses constructing a downstream link are even slightly misarranged. By reducing the thickness of the level '1', the quality of upstream transmission can be improved.

FIGS. 26 through 29 are views for explaining a WDM-PON structure using a seed light (SL) to make an optical transmitter of an OLT 1610 to be agnostic to an optical wavelength, according to an embodiment of the present invention.

Figure 26:
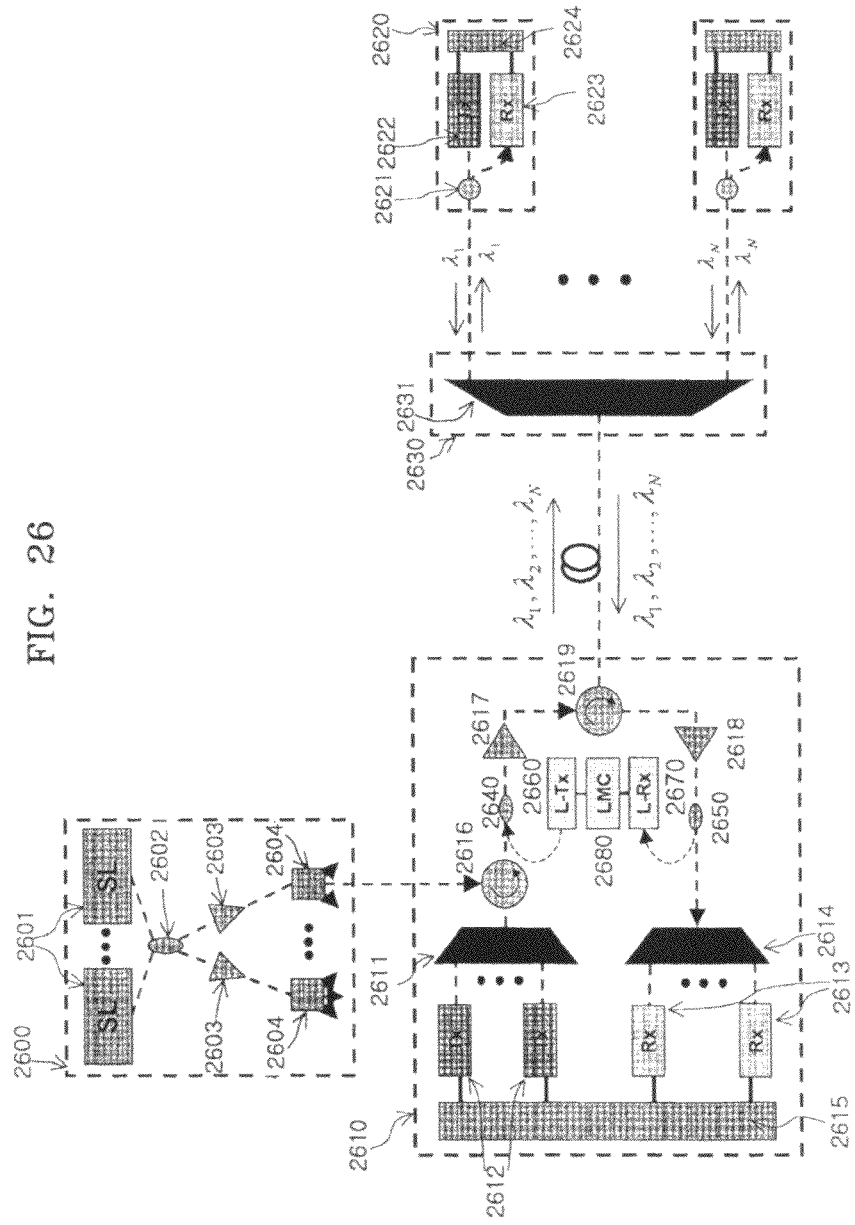
FIGS. 26 through 29 illustrates WDM-PON structures that use a seed light (SL) to make an optical transmitter of an OLT to be agnostic to an optical wavelength, according to embodiments of the present invention.

FIG. 26 illustrates a WDM-PON structure which uses an optical wavelength reusing method for transmitting upstream data by using a seed light in order to implement an OLT 2610 which is agnostic to an optical wavelength and reusing a downstream optical signal as a upstream light in order to implement an ONU 2620 which is agnostic to an optical wavelength.

A feeder path between the OLT 2610 and an RN 2630 is connected by a single optical fiber line. Referring to FIG. 26, the WDM-PON structure includes the OLT 2610, a seed light transmission unit 2600, the RN 2630, and the ONU 2620.

The OLT 2610 includes an OLT protocol processor 2615, a plurality of downstream optical transmission function units, a plurality of upstream light receiving units, a circulator 2619 for dividing upstream and downstream optical signals from each other, and the seed light transmission unit 2600. The respective elements will be described below.

First, the OLT protocol processor 2615 performs a protocol processing function on a downstream electrical signal that is to be transmitted to a subscriber party and a upstream electrical signal that is to be transmitted from the subscriber party.

Each downstream optical transmission function unit includes a plurality of downstream optical transmission modules 2612, a WDM multiplexer (MUX) 2611, a circulator 2616 for dividing a seed light from a downstream optical signal, and a downstream optical signal amplifier 2617.

Each upstream optical reception function unit includes a plurality of optical reception modules 2613, a WDM demultiplexer (DeMUX) 2614, and a upstream optical amplifier 2618.

The operation of the OLT 2610 will be described below.

A seed light which is transmitted from the seed light transmission unit 2600 is in put to the WDM multiplexer (MUX) 2611 through the circulator 2616. In the WDM multiplexer 2611, the seed light is divided according to wavelengths, and each divided seed light is input to the corresponding transmitter 2612. The transmitter 2612 includes an optical agnostic optical unit.

The seed light which is input to the optical agnostic optical unit is amplified and modulated to downstream data which is received from the protocol processor 2615, and then output from the transmitter 2612. The optical signal output from the transmitter 2612 contains downstream data and is input to the WDM multiplexer 2611.

Optical signals output from the plurality of transmitters 2612 are wavelength-multiplexed by the WDM MUX 2611, pass through the circulator 2616 to separate the seed light from the downstream optical signal, are amplified appropriately by the optical amplifier 2617, and then input to a feeder optical fiber line through the circulator 2619 for separating upstream optical signals and downstream optical signals.

Meanwhile, an upstream optical signal transmitted from the ONU 2620 is input to the light receiving function unit through an optical circulator 2619, amplified by an optical amplifier 2618, divided according to wavelengths in the WDM demultiplexer 2614, and then input to the corresponding receiver 2613.

The receiver 2613 converts the optical signal into an electrical signal, restores electrical data from the electrical signal, and then outputs the restored data to the OLT protocol processor 2615.

Meanwhile, the OLT 2610 includes a L-Tx 2660 for transmitting an optical signal for monitoring to truncate the optical fiber line or determine the operation state of a transmitter 2622, an L-Rx 2670 for receiving the optical signal for monitoring, and a Link Monitoring Control (LMC) unit 2680 for controlling the reception and transmission of the optical signal for monitoring, and transmitting information obtained from the optical signal for monitoring to the OLT protocol processor 2615, or receiving and processing a control signal from the OLT protocol processor 2615.

Also, the OLT 2610 includes WDM couplers 2640 and 2650 for transferring the optical signal for monitoring through the optical fiber line in a downstream direction, or receiving the optical signal for monitoring from the optical fiber.

The seed light transmission unit 2600 includes a plurality of seed lights 2601, a n×m (n and m are natural numbers) optical combiner 2602 for collecting and distributing the plurality of seed lights, an optical amplifier 2603 for amplifying light output from the n×m optical combiner 2602, and an optical splitter 2604 for distributing the seed lights to a plurality of OLT 2610.

The operation of the seed light transmission unit 2600 will be described below.

The plurality of SLs 2601 can have different wavelength plans with respect to wavelength intervals and central wavelengths. If the start wavelengths of seed lights are different from each other when the seed lights have the same wavelength interval, seed lights having more narrow wavelength intervals can be obtained by coupling the plurality of SLs 2601 using the coupler 2602. The method can be called a wavelength interleave.

The seed lights that pass through the coupler 2602 are amplified by the optical amplifier 2603 so that they have proper optical powers, and then input to a 1×n splitter 2 604. The 1×n splitter 2604 splits the seed lights according to n light powers, and outputs each seed light to the corresponding OLT 2610.

The RN 2630 includes a WDM multiplexing/demultiplexing unit (MUX/DeMUX) 2631. The WDM multiplexing/demultiplexing unit 2631 operates as a WDM Demultiplexer when receiving a downstream signal so that the downstream signal is divided according to wavelengths, and operates as a WDM multiplexer when receiving a upstream signal so that optical wavelengths are multiplexed and transferred to the OLT 2610.

The ONU 2620 includes an optical combiner 2621, an optical transmitter 2622, an optical receiver 2623, and an ONU protocol processing unit 2624.

The operation of the ONU 2620 will be described below.

The optical combiner 2621 divides power of a downstream optical signal transferred from the WDM demultiplexer 2630 so that some of the power of the downstream optical signal are transferred to the optical receiver 2623 so as to restore them to downstream data and the remaining part of the power of the downstream optical signal is injected to the optical transmitter 2622.

The downstream optical signal injected to the optical transmitter 2622 is converted into a signal which can be reused as an upstream light through flattening and optical-amplification, and successively the reused light is converted into a upstream optical signal by an electrical signal which is transmitted from the ONU protocol processing unit 2624 and contains upstream data, and then is output from the optical transmitter 2622. Since the optical transmitter 2622 of the ONU 2620 can use optical wavelengths that are included within a predetermined wavelength band not considering their wavelengths, by using a RSOA or SOA, the same type of the optical transmitter 2622 can receive all WDM channels.

Figure 27:
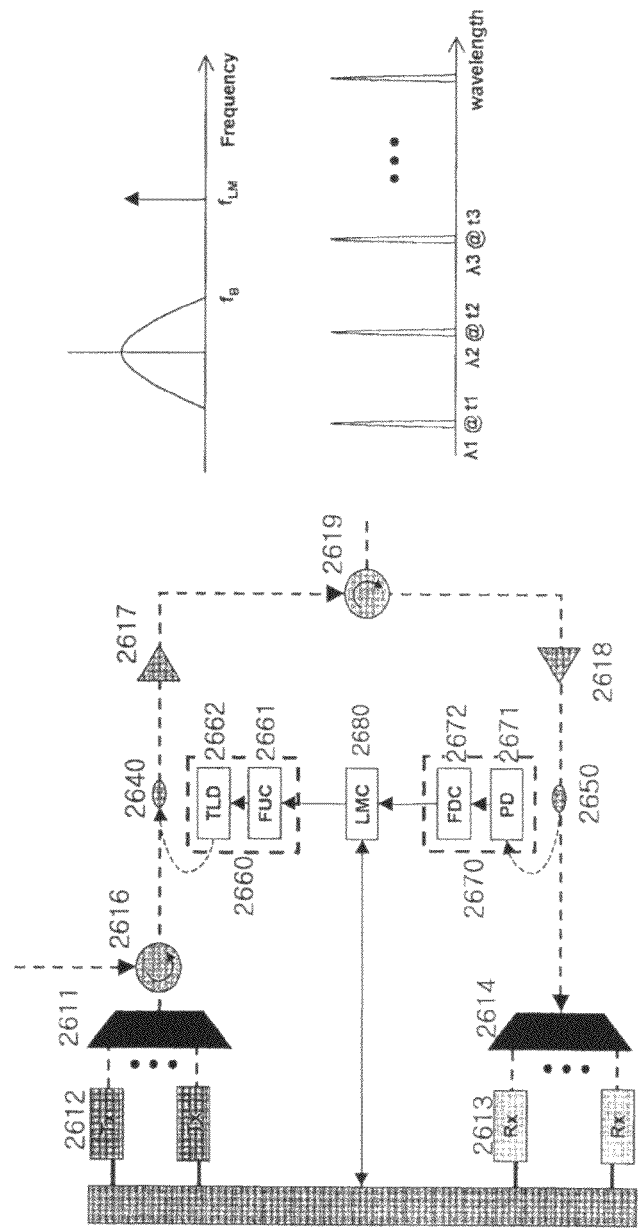

FIG. 27 shows a detailed structure of a L-Tx 2660, a L-Rx 2670, and a LMC 2680 that are included in the OLT 2610, in order to determine optical fiber truncation between the OLT 2610 and the ONU 2620 or the operation state of the optical transmitter 2622 of the ONU 2620.

The LMC 2680 receives a control signal regarding monitoring of an optical link state from the OLT protocol processing unit 2615.

Here, for example, the LMC 2680 transmits a signal for controlling a Tunable LD (TLD) 2662 to the TLD 2662, and an electrical signal (hereinafter, referred to as an electrical signal for monitoring) that is to be sent while being contained in a light for monitoring an optical link state, to the FUC 2661, as illustrated in FIG. 27, so that lights having different wavelengths are periodically transmitted.

The FUC 2661 frequency-up-converts the received electrical signal into a RF carrier $f_{LM}$ which is sufficiently distant from a data reception/transmission band (hereinafter, referred to as a base band $f_B$), as illustrated in FIG. 27, and then sends the frequency-up-converted signal to the TLD 2662.

The TLD 2662 modulates the frequency-up-converted signal at the corresponding wavelength according to a wavelength designation signal received by the LMC 2680, and transmits the resultant signal through the WDM combiner 2640 in a downstream direction.

The optical signal for monitoring which has injected to the optical fiber line through the WDM combiner 2640 passes through the feeder fiber line and the RN 2630, and then is input to the ONU 2620. Some of optical power of the optical signal for monitoring input to the ONU 2620 are input to the optical transmitter 2622 and subjected to amplification and wavelength-reusing processing, and then again transmitted in the upstream direction.

The optical signal for monitoring transmitted in the upstream direction is transmitted to the PD 2671 through the optical coupler 2650, and then converted into an electrical signal. The output signal of the PD 2671 is frequency-down-converted into a base band in the FDC 2671, and then transmitted to a LMC 2680.

The remaining part of the optical signal for monitoring transmitted to the ONU 2620 is transmitted to the optical receiver 2623. However, since a Low Pass Filter (LPF) is generally included in a TIA included in the receiver 2623, and the LPF passes only a baseband of the received signal therethrough and removes a signal such as an electrical signal for monitoring which is sufficiently distant from the base band, the electrical signal for monitoring has no influence on restoring of downstream data.

Meanwhile, for example, the case where optical fiber truncation occurs in a feeder fiber path can be detected when signals for monitoring corresponding to all wavelengths are not received. Also, for example, when optical fiber truncation occurs in a distribution network path, an optical signal for monitoring corresponding to the truncated optical fiber is not received.

Also, meanwhile, by using a high sensitive PD 2671, lights reflected on a truncated surface by truncation of an optical fiber can be sensed, the optical transmitter 2622 absorbs all the received lights when the ONU 2620 is in a power-off state, and thus the power-off state of the ONU 2620 and the truncation state of the optical fiber can be distinguished from each other.

Also, meanwhile, since the LMC 2680 has an optical time domain reflectometer function, the LMC 2680 can accurately detect a location at which the optical fiber is truncated.

Also, for example, in case of a WDM-TDM-PON, since the RN 2630 includes a splitter 2633, an optical wavelength is shared by a plurality of ONUs 2620. In this case, generally, the OLT 2610 has difficulties in detecting truncation of an optical fiber in a distribution network path.

However, in this case, according to the present invention, by utilizing upstream transmission time information distributed for an ONU by an OLT MAC layer, to transmit an optical wavelength which a specific ONU receives during a time period assigned to the ONU, and receive an optical signal returned from the ONU during the corresponding time period, truncation of an optical fiber in the distribution network path can be detected, and accordingly truncation of the optical fiber can be determined over the entire path from the OLT 2610 to a specific ONU 2620.

Meanwhile, some of power of the optical signal for monitoring pass through the WDM coupler 2650 and are transmitted to the optical receiver 2613 for data reception. Since a transimpedance amplifier (TIA) installed in the receiver 2613 generally includes a LPF, the receiver 2613 passes only the base band of the received signal therethrough and removes a signal such as an electrical signal for monitoring which is sufficiently distant from the base band. Therefore, the electrical signal for monitoring has no influence on restoring of upstream data.

Figure 28:
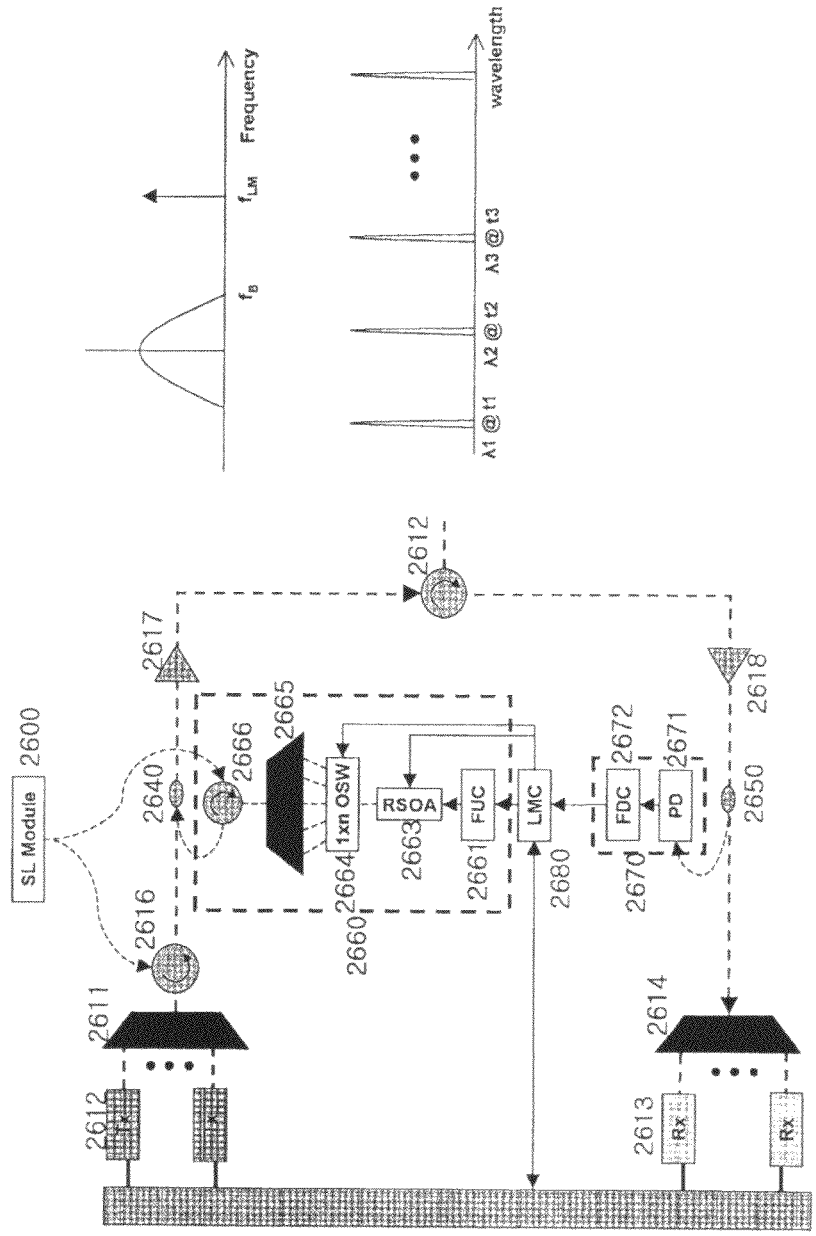

FIG. 28 shows a detailed structure of a L-Tx 2660, a L-Rx, and a LMC 2680 included in the OLT 2610, according to another embodiment of the present invention, in order to determine truncation of an optical fiber between the OLT 2610 and the ONU 2620 or the operation state of the transmitter 2622 of the ONU 2620.

The structure illustrated in FIG. 28 is similar to the structure illustrated in FIG. 27, except that the structure illustrated in FIG. 27 utilizes the TLD 2662 as the L-Tx 2660, while the structure illustrated in FIG. 28 utilizes the RSOA 2663, a 1×n Optical Switch (OSW) 2664, and a WDM multiplexer 2665 as the L-Tx 2660.

A seed light is sent from the SL module 2600 to a WDM multiplexer 2665 through the circulator 2666. The WDM multiplexer 2665 divides the seed light according to wavelengths and transfers each light to an optical switch 2664.

The optical switch 2664 transfers a specific optical wavelength to the RSOA 2663 under the control of the LMC 2680. The RSOA 2663 amplifies and reflects the light and then modulates the resultant light by current which is injected from a FUC 2661.

The modulated light is injected to a downstream optical fiber line through the optical switch 2664, the WDM multiplexer 2665, the circulator 2666 and the WDM coupler 2640.

Another difference between the structure illustrated in FIG. 28 and the structure illustrated in FIG. 27 is that the wavelength of a light output from the transmitter 2612 is exactly equal to the wavelength of a light output from the L-Tx 2660 in the structure illustrated in FIG. 28, and accordingly a beating phenomenon between optical wavelengths can be processed easily compared to the structure illustrated in FIG. 27 in which optical wavelength differences of two optical sources are not uniform.

Figure 29:
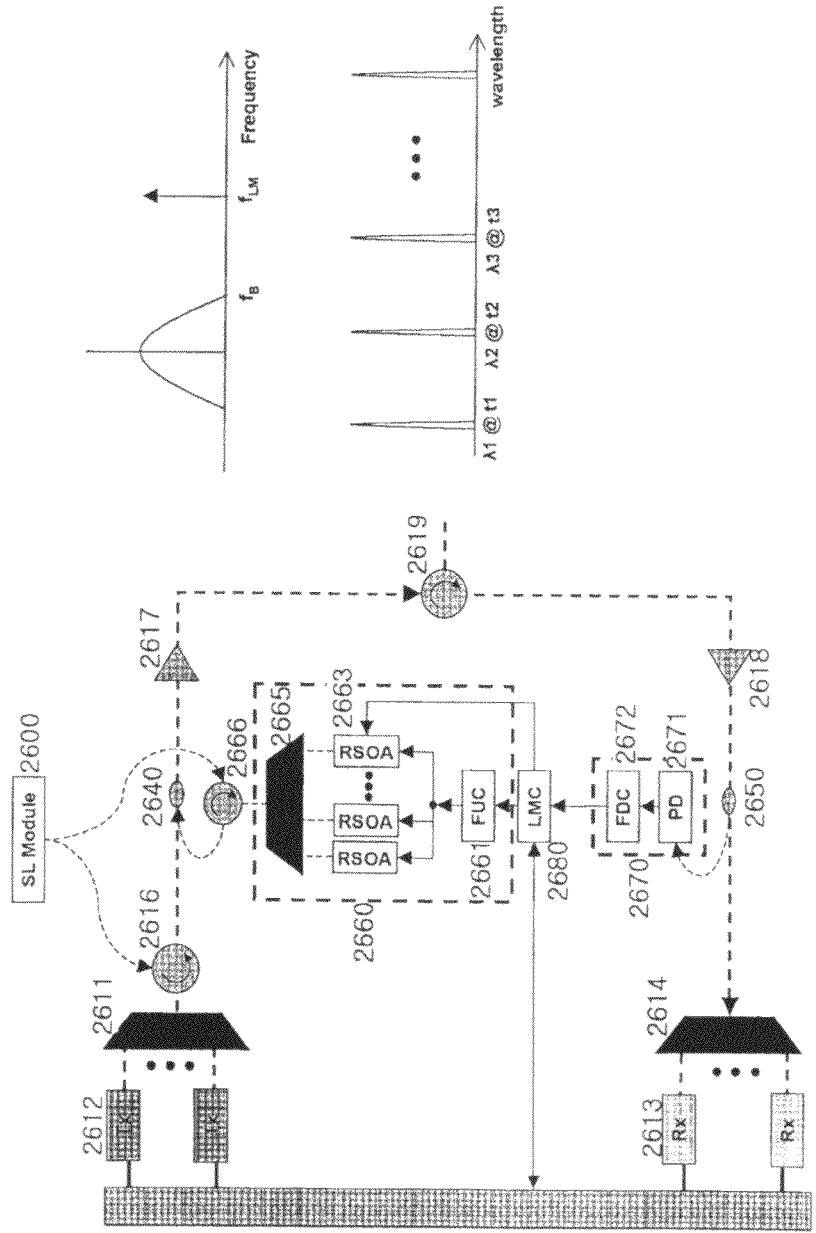

FIG. 29 shows a detailed structure of a L-Tx 2660, a L-Rx 2670, and a LMC 2680 included in the OLT 2610, according to another embodiment of the present invention, in order to determine truncation of an optical fiber between the OLT 2610 and the ONU 2620 or the operation state of the transmitter 2622 of the ONU 2620.

The structure illustrated in FIG. 29 is similar to the structure illustrated in FIG. 27, except that the structure illustrated in FIG. 29 utilizes a TLD 2662 as the L-Tx 2660, while the structure illustrated in FIG. 29 utilizes a RSOA 2663 and a WDM multiplexer 2665 as the L-Tx 2660.

A seed light is input from the SL module 2600 to the WDM multiplexer 2665 through the circulator 2666. The WDM multiplexer 2665 divides the seed light according to wavelengths, and transfers each light to an RSOA array 2663.

The RSOA array 2663 amplifies and reflects the light and then modulates the resultant light using a current injected from the FUC 2661, under the control of the LMC 2680.

The modulated light is injected to a downstream light fiber line through the WDM multiplexer 2665, the circulator 2666, and the WDM coupler 2640. As illustrated in FIG. 28, since the wavelength of a light output from the L-Tx 2612 is exactly equal to the wavelength of a light output from the L-Tx 2660, the structure illustrated in FIG. 28 can process a beating phenomenon between light wavelengths easily compared to the structure illustrated in FIG. 27 in which a difference between light wavelengths of two light sources is not uniform.

FIGS. 30 through 33 are views illustrating an output spectrum of a seed light and a spectrum which has passed through a WDM demultiplexer, when a MWLS is used as the SL, according to an embodiment of the present invention.

Figure 30:
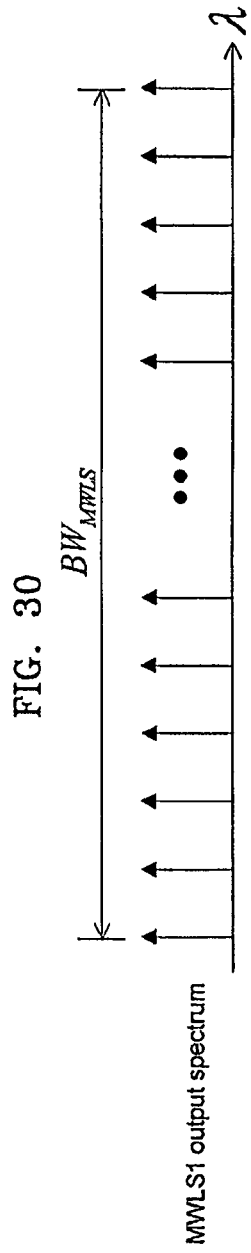
FIGS. 30 through 33 are views for explaining an output spectrum of a seed light and an output spectrum which has passed through a WDM Demultiplexer, when a MWLS is used as the seed light, according to embodiments of the present invention.

FIG. 30 shows a light spectrum which is output from seed lights 2601, a passband of the WDM multiplexer 2611 (see FIG. 29), and a spectrum which has passed through the WDM multiplexer 2611, when a MWLS is used as a seed light 2601.

Figure 31:
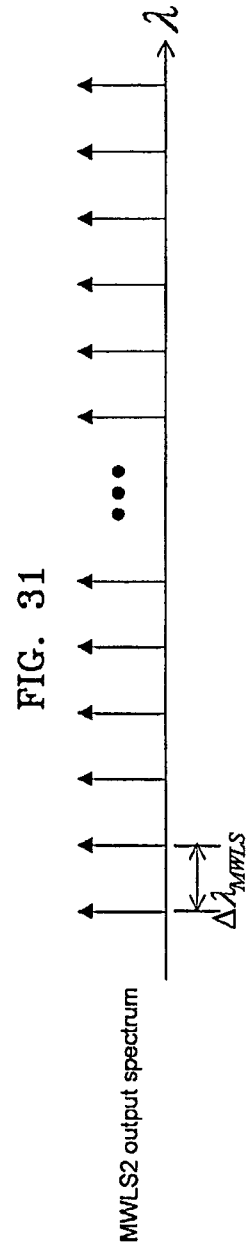

An optical spectrum which is output from each MWLS, as illustrated in FIGS. 30 and 31, includes a plurality of wavelengths. In FIGS. 30 and 31, each MWLS has the same wavelength of $\Delta\lambda_{WDM}$, but their central wavelengths are arranged in an interlaced format.

Accordingly, if the two MWLSs are combined by a coupler, optical wavelengths of the two MWLSs have an interlaced form and thus a wavelength interval of an output spectrum is reduced to half its original wavelength interval.

Figure 32:
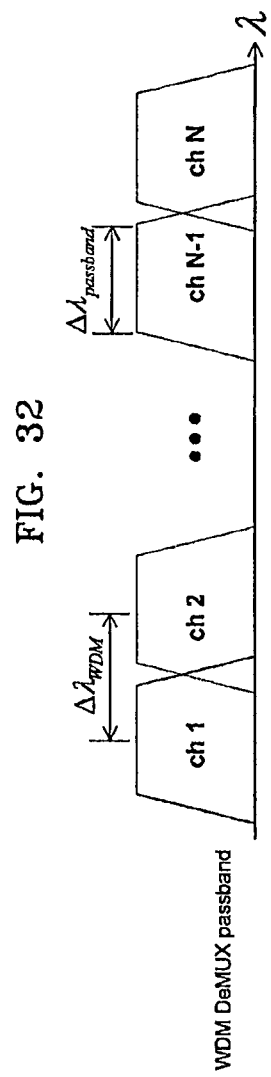
Figure 33:
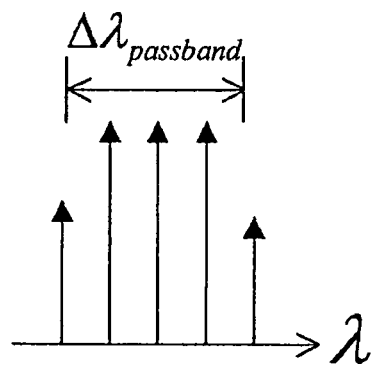

Accordingly, if an output light whose optical wavelengths are more narrowly arranged passes through the WDM multiplexer 2611 having a passband format illustrated in FIG. 32, the output light will have a spectrum illustrated in FIG. 33.

Each pass band of the WDM MUX 2611 for determining a communication channel includes three optical wavelengths.

As such, when several wavelengths exist in a single WDM channel, a downstream optical signal is distorted and power penalty can be generated due to divergence of optical fibers if the transmission distance is distant. Accordingly, the wavelength interval of a seed light and the number of wavelengths of a seed light which is included in a pass band of the WDM multiplexer have to be considered properly according to the transmission distance.

Figure 34:
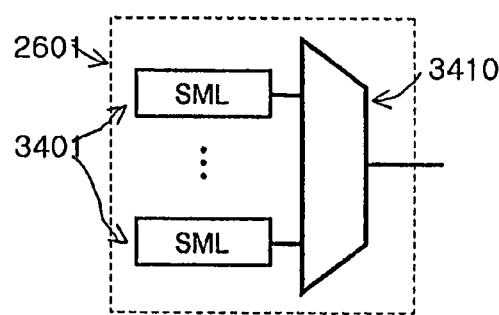
FIGS. 34 through 36 illustrates MWLS modules according to embodiments of the present invention.
Figure 35:
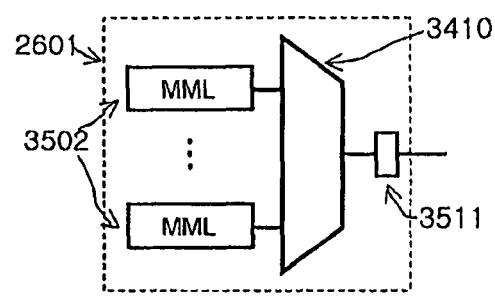
Figure 36:
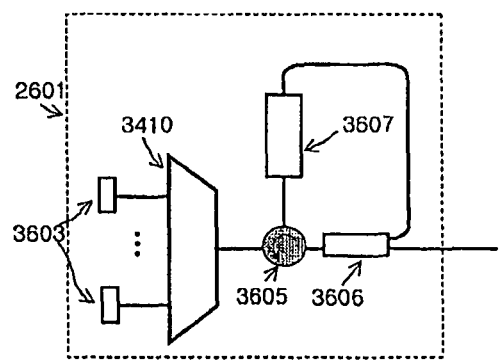

FIGS. 34 through 36 illustrate three embodiments for implementing a MWLS according to an embodiment of the present invention.

A structure, such as a DFB-LD, in which a single mode laser (SML) array 3401 and a WDM multiplexer 3410 are combined individually with each other, as illustrated in FIG. 34, and a structure, such as a Fabry-Perot Laser Diode (FP-LD), in which a multimode laser (MML) array 3502 and a WDM multiplexer 3401 are combined individually with each other, are all possible.

As illustrated in FIG. 35, a half mirror 3511 can be added to the output terminal of the WDM multiplexer 3410 in order to improve the characteristic of an output light.

The structure illustrated in FIG. 36 includes an optical reflection unit 3603, a WDM multiplexer 3410, an optical amplifier 3607, a circulator 3605, and a 1×2 coupler 3606

In this embodiment, a mirror can be used as the optical reflective unit 3603 and can adjust an optical power difference between seed light output optical wavelengths by varying a reflection ratio or an optical attenuation ratio.

Also, an active element such as a RSOA can be used as the optical reflective unit 3603. In this case, since the output light of each RSOA is modulated to an electrical signal, a plurality of modulated optical signals can be output from a SL 2601.

The optical amplifier 3607 may be an optical fiber optical amplifier or a semiconductor optical amplifier.

The operation of the MWLS 2601 illustrated in FIG. 36 will be described below.

A light generated by the optical amplifier 3607 is input to the circulator 3605 and the WDM MUX 3410. The light input to the WDM multiplexer 3401 is divided according to optical wavelengths and output to the optical reflective unit 3603. The light is reflected by the light reflective unit 3603 and then again input to the WDM multiplexer 3410

The light output from the WDM multiplexer 3410 is input to the 1×2 optical coupler 3606 through the circulator 3605. Some of optical power input to the optical coupler 3606 are output outside the MWLS 2601 and the remaining part of the optical power is again input to the optical amplifier 3607.

Accordingly, "the optical amplifier 3607-the circulator 3605-the WDM multiplexer 3410-the optical reflective unit 3603-the WDM multiplexer 3410-the circulator 3605-the optical combiner 3606-the optical amplifier 3607" form a closed loop.

The light generated by the optical amplifier 3607 is converted into a light having a lasing characteristic or a characteristic similar to the lasing characteristic, while the light passes through the closed loop, and then output outside the MWLS 2601.

Figure 37:
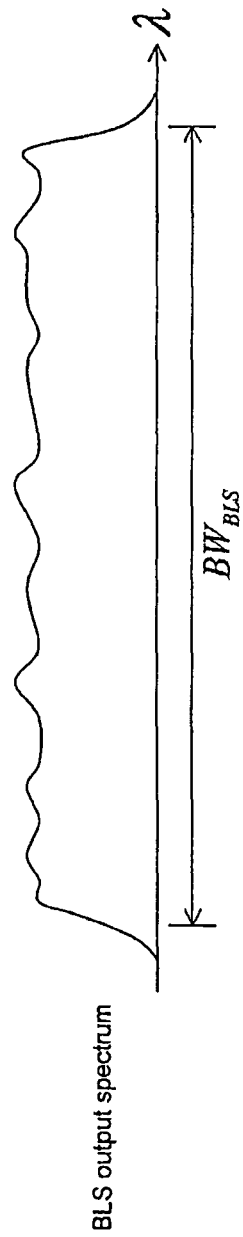
FIGS. 37 through 39 are views for explaining an output spectrum of a BLS, a pass band of a WDM multiplexing/demultiplexing unit, and an output spectrum which has passed through the WDM multiplexing/demultiplexing unit, when the BLS is used as a seed light, according to embodiments of the present invention.
Figure 38:
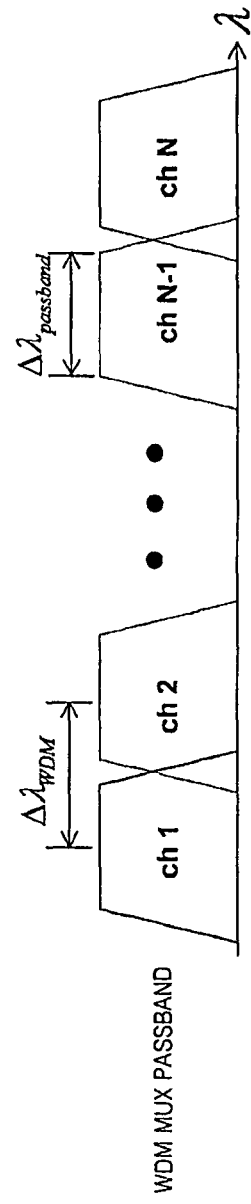
Figure 39:
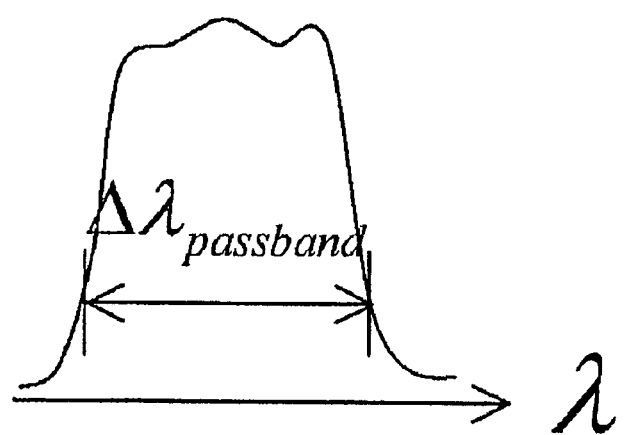

FIGS. 37 through 39 are views illustrating an output spectrum of a BLS, a pass band of a WDM multiplexing/demultiplexing unit (MUX/DeMUX), and an output spectrum which has passed through the WDM multiplexing/demultiplexing unit, when the BLS is used as a seed light, according to an embodiment of the present invention.

FIG. 37 illustrates an output spectrum of the BLS, FIG. 38 illustrates a pass band of a WDM multiplexer (MUX), and FIG. 39 illustrates an output spectrum for a specific channel which has passed through the WDM multiplexer.

Since the output bandwidth of the WDM multiplexer depends on the pass band of the WDM multiplexer, a transmission distance and a pass band of the WDM multiplexer have to be determined considering power penalty due to divergence of optical fibers in the case of long distance transmission. The BLS can be implemented in various forms.

For example, the BLS can be implemented using a semiconductor Superlumine scent LED (SLD), an erbium-doped fiber amplifier Amplified Spontaneous Emission (ASE) light source, a semiconductor optical amplifier ASE light source, etc.

Figure 40:
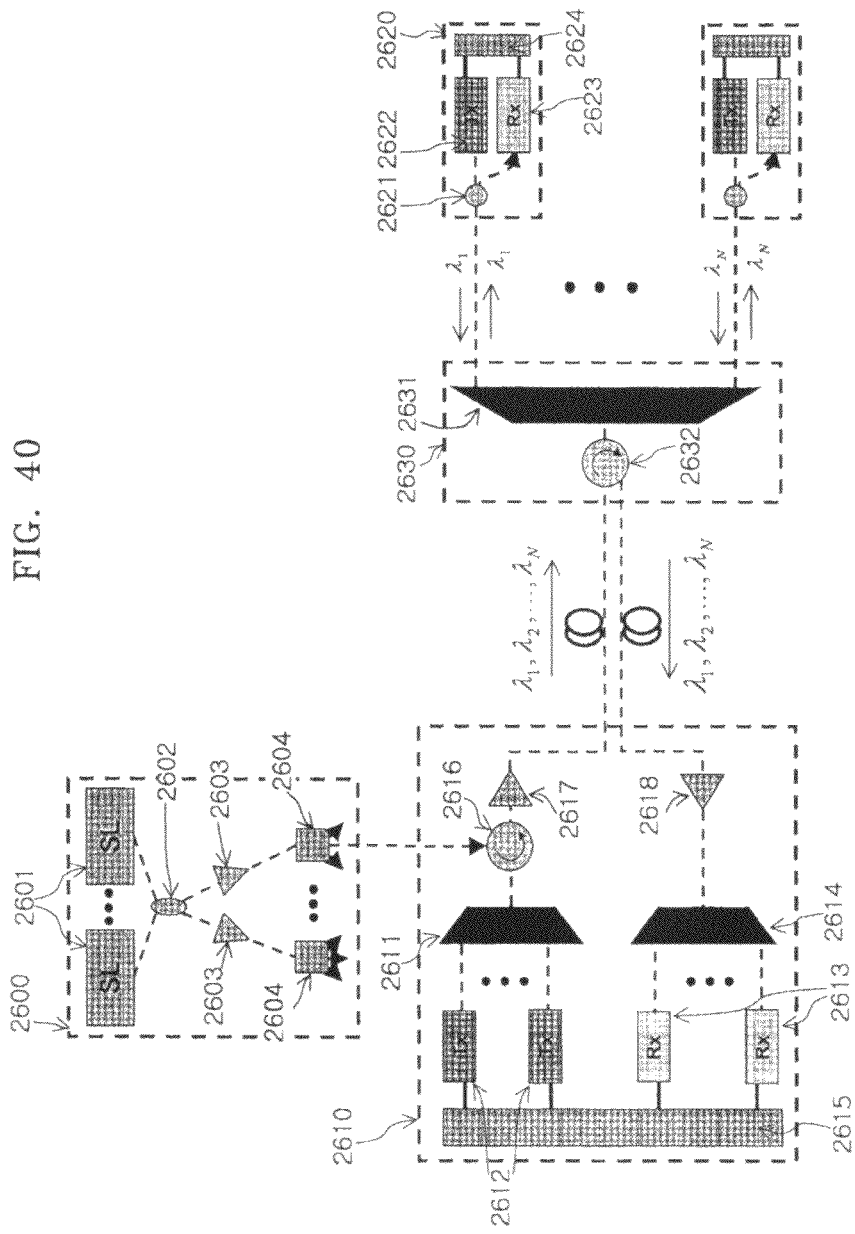
FIG. 40 illustrates a WDM-PON structure in which an optical fiber line for upstream transmission is separated from an optical fiber line for downstream transmission in a feeder between an OLT and an Remote Node (RN), according to an embodiment of the present invention.

FIG. 40 illustrates a WDM-PON structure in which optical fibers for upstream transmission are separated from optical fibers for downstream transmission in a feeder path between an OLT 2610 and an RN 2630, according to an embodiment of the present invention.

The WDM-PON structure illustrated in FIG. 40 is the same as the structure illustrated in FIG. 26, except that upstream transmission and downstream transmission are respectively performed through different optical fibers in the feeder path between the OLT 2610 and the RN 2630.

For that, a circulator 312 (2619 in FIG. 26) for dividing a upstream optical signal and a downstream optical signal included in the OLT 2610 from each other is included in the RN 2630. The remaining elements illustrated in FIG. 40 is the same as the corresponding elements illustrated in FIG. 26.

Since the structure illustrated in FIG. 40 performs upstream and downstream transmission through separate optical fibers, the structure illustrated in FIG. 40 is relatively resistant to reflection of various optical signals that are generated in the feeder path. Accordingly, the structure illustrated in FIG. 40 has less limit in transmission distance with respect to optical signal reflection and accordingly is suitable for long distance trans mission.

Figure 41:
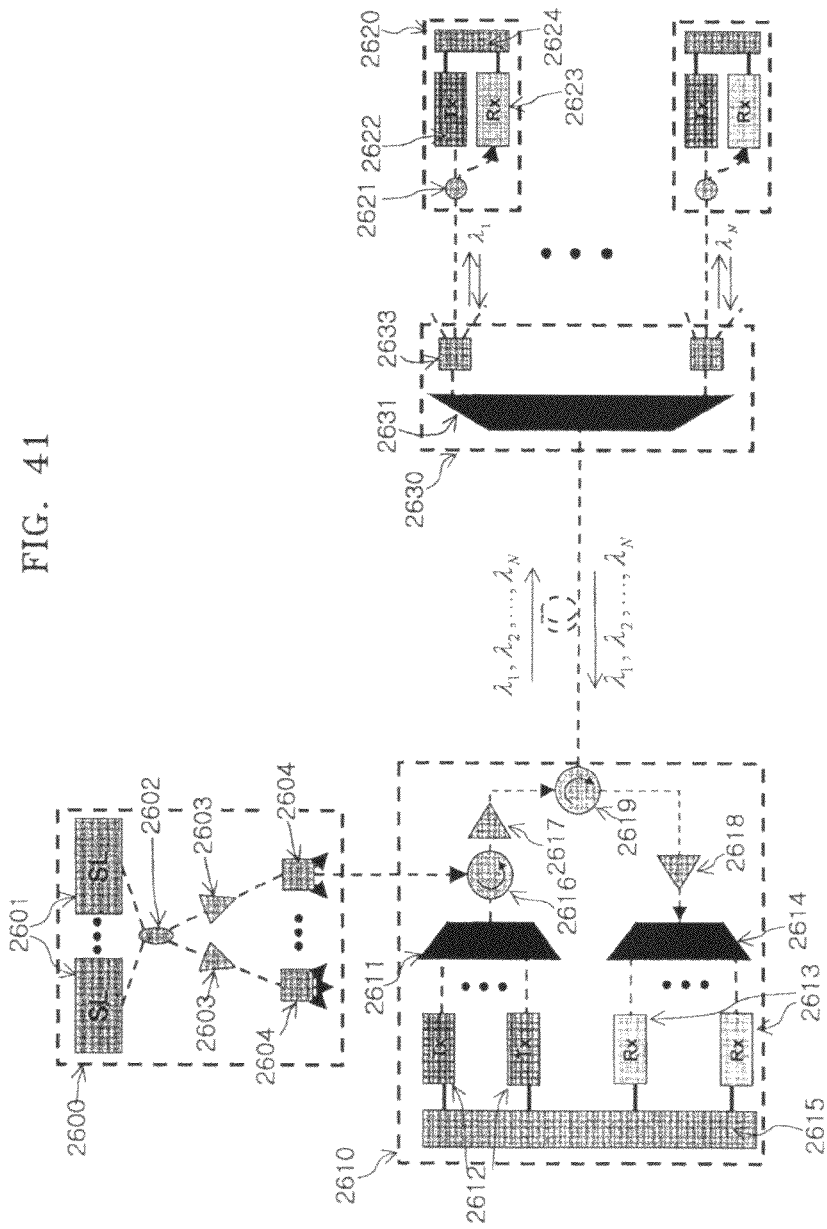
FIG. 41 illustrates a WDM-TDMA-PON structure using a seed light to make an optical transmitter of an OLT to be agnostic to an optical wavelength, according to an embodiment of the present invention.

FIG. 41 illustrates a WDM-TDMA-PON structure using a seed light to make optical transmission of an OLT to be agnostic to an optical wavelength, according to an embodiment of the present invention.

FIG. 41 illustrates a WDM-TDM-PON structure using an optical wavelength reusing method in which a seed light is used in order to implement an OLT which is agnostic to optical wavelengths, a downstream optical signal is reused as a upstream light, and upstream data is transmitted in order to implement an ONU which is agnostic to optical wavelengths.

A feeder path between an OLT and an RN is connected by a single optical fiber line.

The WDM-TDMA-PON which is agnostic to an optical wavelength includes an OLT 2610, a seed light transmission unit 2600, an RN 2630, and a plurality of ONUs 2620.

The OLT 2610 has the same structure as that of the OLT illustrated in FIG. 26, except that a upstream light receiving unit can receive a burst mode optical packet because a upstream optical signal has a burst mode characteristic by utilizing a TDMA method.

The structure of the seed light transmission unit 2600 has been described above with reference to FIG. 26.

The RN 2630 includes a WDM multiplexing/demultiplexing unit (MUX/DeMUX) 2631 and a 1×n optical power splitter 2633. A downstream signal 2630 which is input to the RN 2630 is divided according to optical wavelengths in the WDM multiplexing/demultiplexing unit 2631, and each wavelength is input to the 1×n optical power splitter 2633. Optical power of the wavelength is divided to 1/n by the 1×n optical power splitter 2633, and the divided optical power is output to the plurality of ONUs 2620.

Upstream optical signals having the same wavelengths, that are transmitted from the ONUs 2610, are combined by the optical power splitter 2633 and then input to the WDM multiplexing/demultiplexing unit (MUX/DeMUX) 2631. In the WDM multiplexing/demultiplexing unit 2631, optical signals having different optical wavelengths are wavelength-multiplexed and output to the OLT 2610.

The structure of each ONU 2620 is the same as that of the corresponding structure illustrated in FIG. 26, except that an upstream signal has a burst mode characteristic because ONUs transmitting the same wavelength have to transmit optical signals only at a given specific time slot. Accordingly, the optical transmitter 2622 can have to transmit a burst mode.

Figure 42:
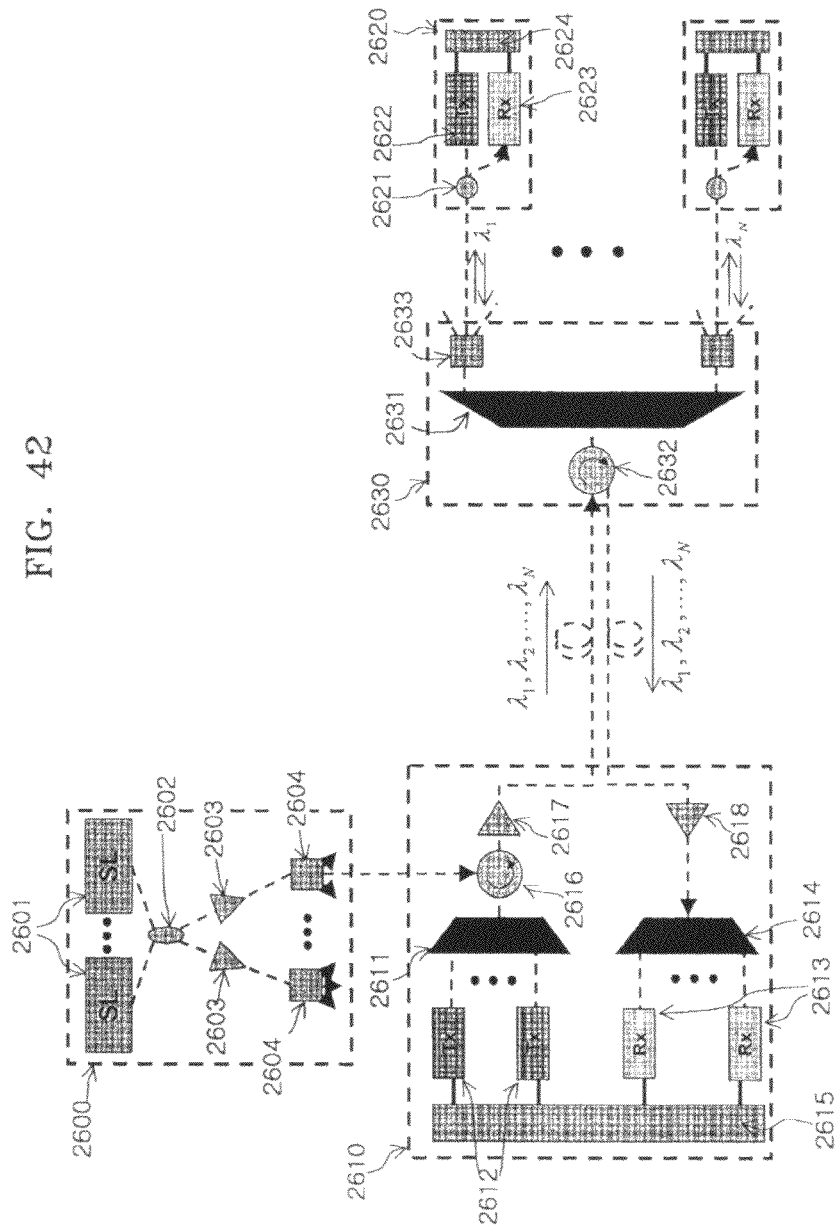
FIG. 42 illustrates a WDM-TDMA-PON structure in which an optical fiber line for upstream transmission is separated from an optical fiber line for downstream transmission in a feeder path between an OLT and an RN, according to an embodiment of the present invention.

FIG. 42 illustrates a WDM-TDMA-PON structure in which optical fibers for upstream transmission are separated from optical fibers for downstream transmission in a feeder path between an OLT 2610 and an RN 2630, according to an embodiment of the present invention.

The structure illustrated in FIG. 42 is the same as the structure illustrated in FIG. 41, except that optical fibers for upstream transmission are separated from optical fibers for downstream transmission in a feeder path between the OLT 2610 and the RN 2630.

For that, a circulator 2632 (2619 in FIG. 26) for dividing upstream and downstream optical signals included in the OLT 2610 from each other is included in the RN 2630.

The structure illustrated in FIG. 42 is relatively resistant to reflection of various optical signals that are generated in the feeder path because optical fibers for upstream transmission are separated from optical fibers for downstream transmission.

Figure 43:
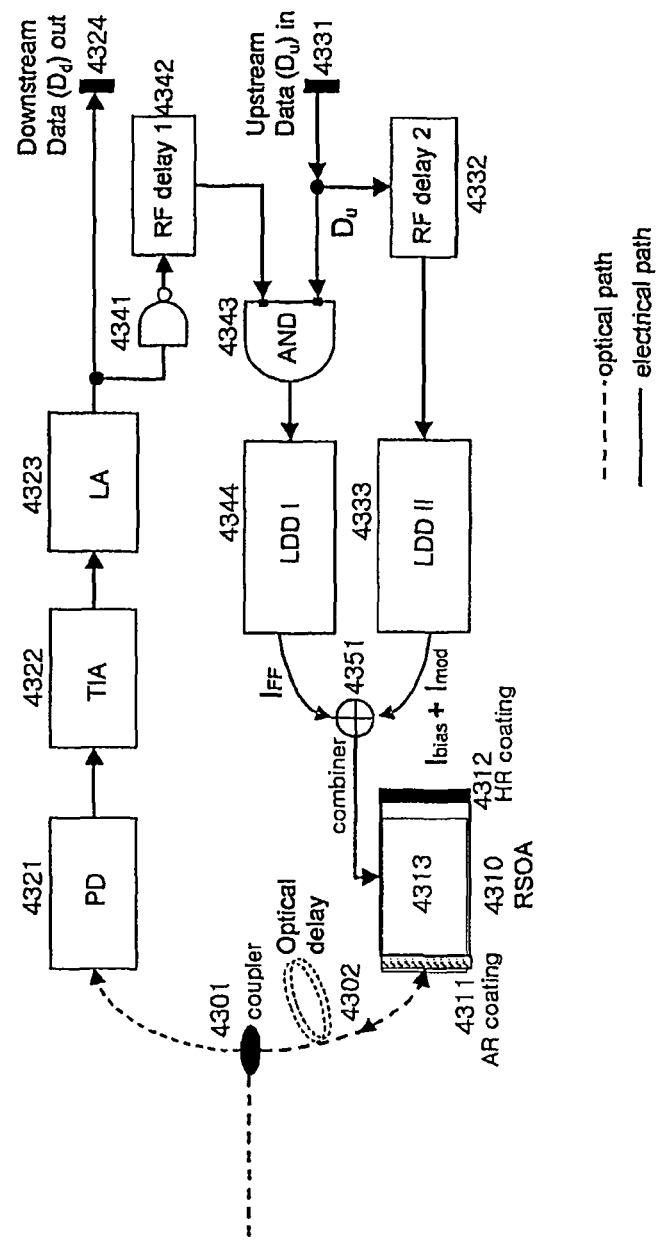
FIGS. 43 through 45 illustrate the structures of RSOA-based input optical wavelength reusing apparatuses according to embodiments of the present invention.
Figure 44:
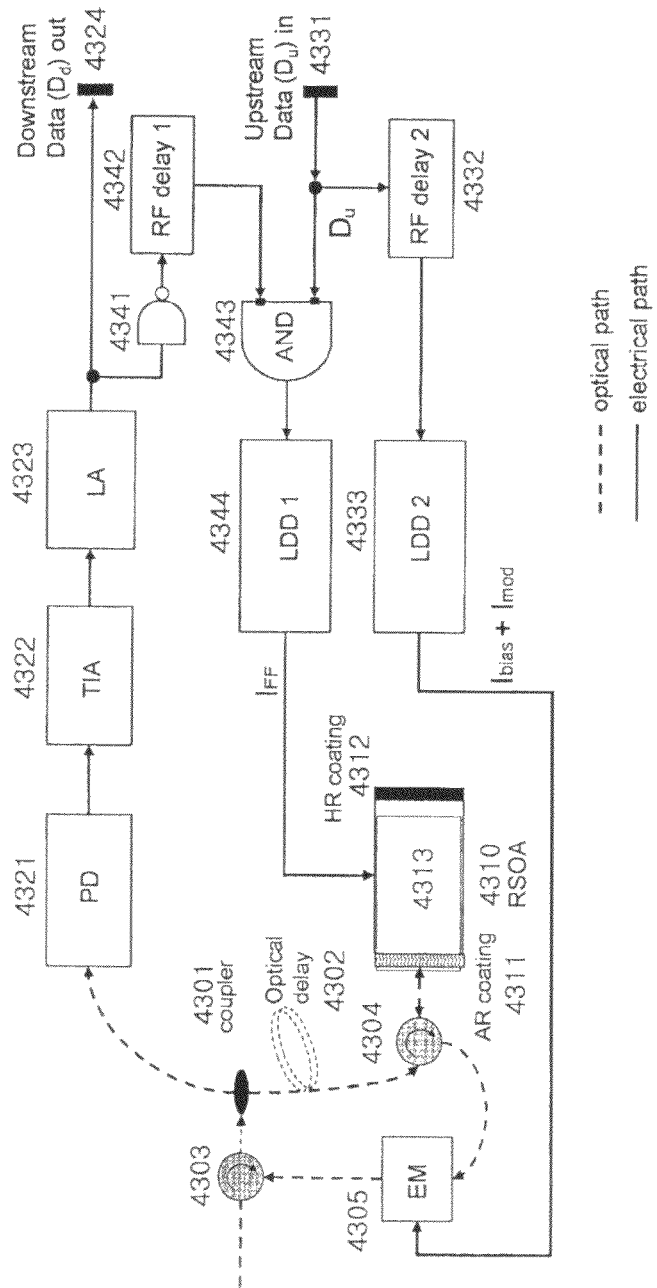
Figure 45:
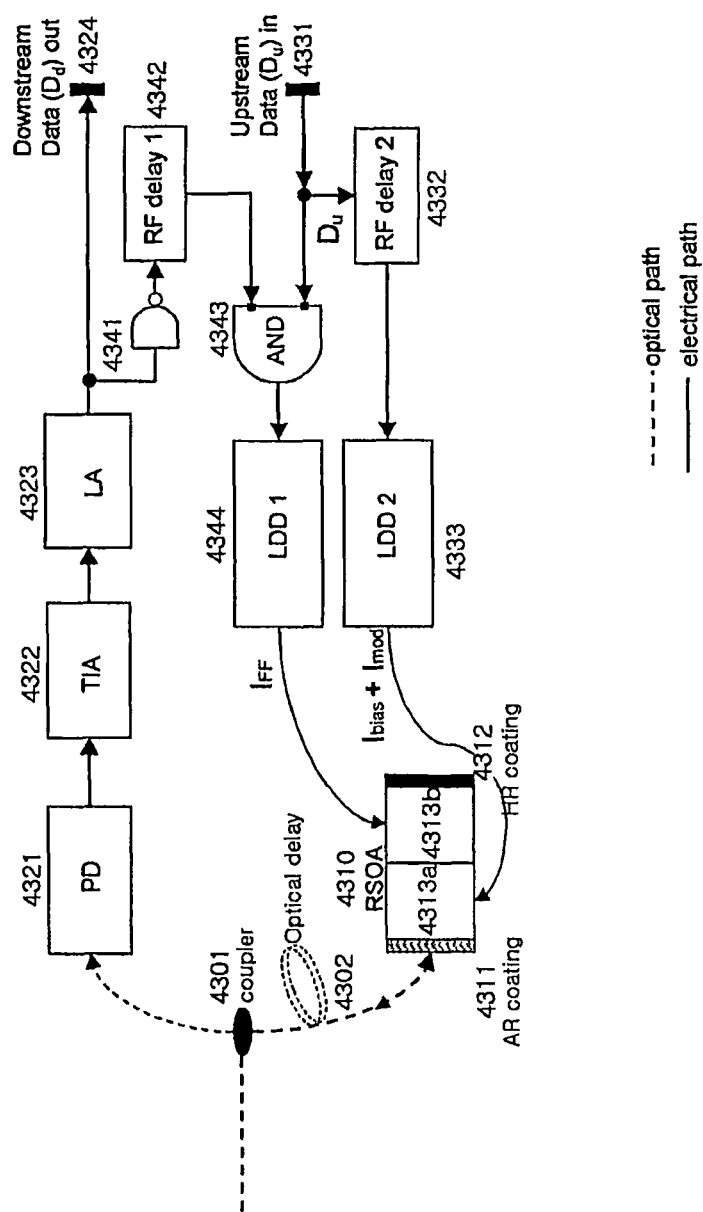

FIGS. 43 through 45 illustrate the structures of an RSOA-based input optical wavelength reusing apparatus according to an embodiment of the present invention.

Referring to FIG. 43, the RSOA-based input optical wavelength reusing apparatus includes an optical coupler 4301, a PD 4321, a transimpedance amplifier (TIA) 4322, a limiting amplifier (LA) 4323, an inverter 4341, a first RF delay 4342, an AND gate 4343, a first laser driver (LDD1) 4344, a second laser driver (LDD2) 4333, an electrical signal combiner 4351, a RSOA 4310, and an optical delay 4302.

A downstream optical signal which is received from a telephone office is divided by the optical coupler 4301, in such a manner that some of the downstream optical signal are input to the RSOA 4310 and the remaining part of the downstream optical signal is input to the PD 4321. The downstream optical signal input to the PD 4321 is converted into a current signal and then output to the transimpedance amplifier 4322. The electrical signal is amplified by the transimpedance amplifier 4322, converted into a voltage signal, and then transferred to the limiting amplifier 4323. The limiting amplifier 4323 re-amplifies the received voltage signal.

Some of the output signal of the limiting amplifier 4323 are output to the downstream data signal processor 4324, and the remaining part of the output signal is inverted in polarity by the inverter 4341, and then input to the first RF delay 4342. Here, if the limiting amplifier 4323 has an output terminal for inverting the polarity of a signal and outputting it, the output signal is directly transferred to the first RF delay 4342 without passing through the inverter 4341.

The output signal of the first RF delay 4342 is input to the AND gate 4343.

Accordingly, some of power of the downstream signal are input to an input terminal of the AND gate 4343, and some of power of a upstream signal are input to the other input terminal of the AND gate 4343.

Therefore, the downstream signal passes through the AND gate 4343 when the upstream signal has a level '1', and cannot pass through the AND gate 4343 when the upstream signal has a level '0'. The output signal of the AND gate 4343 is converted into a modulated signal by the first LDD 4344, and then output.

The remaining part of the power of the upstream signal is input to the second LDD 4333 through the second RF delay 4332, converted into a modulated signal by the second LDD 4333, and then output with a bias current. The output signal of the first LDD 4344 and the output signal of the second LDD 4333 are combined by the combiner 4351 and then injected to the RSOA 4313.

Some of the downstream optical signal divided by the optical coupler 4301 are input to the front facet 4311 of the RSOA 4310, reflected by the rear facet 4312 of the RSOA 4310, and then again transmitted through the front facet 4311.

In order to optimally reuse the optical wavelength of a downstream optical signal which is input to the RSOA 4310, the phase of a preceding injection current which is finally output from the first LDD 4344 and the phase of a downstream optical signal which is input to the RSOA 4310 have to be optimally matched. Matching of the both phases is performed by the optical delay 4302 and the first RF delay 4342.

Meanwhile, since some of power of the upstream optical signal is input to the combiner 4351 through the AND gate 4343 and the first LDD 4344, and the remaining part of the power of the upstream optical signal is input to the combiner 4351 through the second LDD 4333, the phases of the two signals are different from each other. The second RF delay 4332 functions to match the phases of the two signals.

The structure illustrated in FIG. 44 is the same as the structure illustrated in FIG. 43. In a method of directly modulating a downstream signal to upstream data in a RSOA, there are difficulties in modulating a signal to data whose size exceeds 2.5 Gbps due to the characteristic of the RSOA.

In order to modulate a signal to data whose size is larger than 2.5 Gbps, the output light of the RSOA is modulated by an external modulator (EM) 4305.

Therefore, a circulator 4304 for transmitting the output signal of the RSOA 4310 to the EM 4305 and a circulator 4303 for transmitting the output signal of the EM 4305 to a network are further included. A difference between the structure illustrated in FIG. 44 and the structure illustrated in FIG. 43 is that the output signal of the first LDD 4344 is input to the RSOA 4310 and the output signal of the second LDD 4333 is input to the EM 4305.

Therefore, the RSOA 4310 performs input optical wavelength reusing and amplification on an input optical signal using a FFCI. Light modulation of upstream data is performed by the EM 4305.

The structure illustrated in FIG. 45 is the same as that illustrated in FIG. 43, except that an active region of the RSOA 4310 is divided into two sections.

A upstream data current signal which is received from the second LDD 4333 is injected together with a bias current to the front section 4313a of the two section RSOA 4310, and a current signal for FFCI which is received from the first LDD 4344 is input to the rear section 4313b of the two sections of the RSOA 4310.

FIGS. 46 through 49 illustrate the structures of a SOA-based input optical wavelength reusing apparatus according to an embodiment of the present invention.

Figure 46:
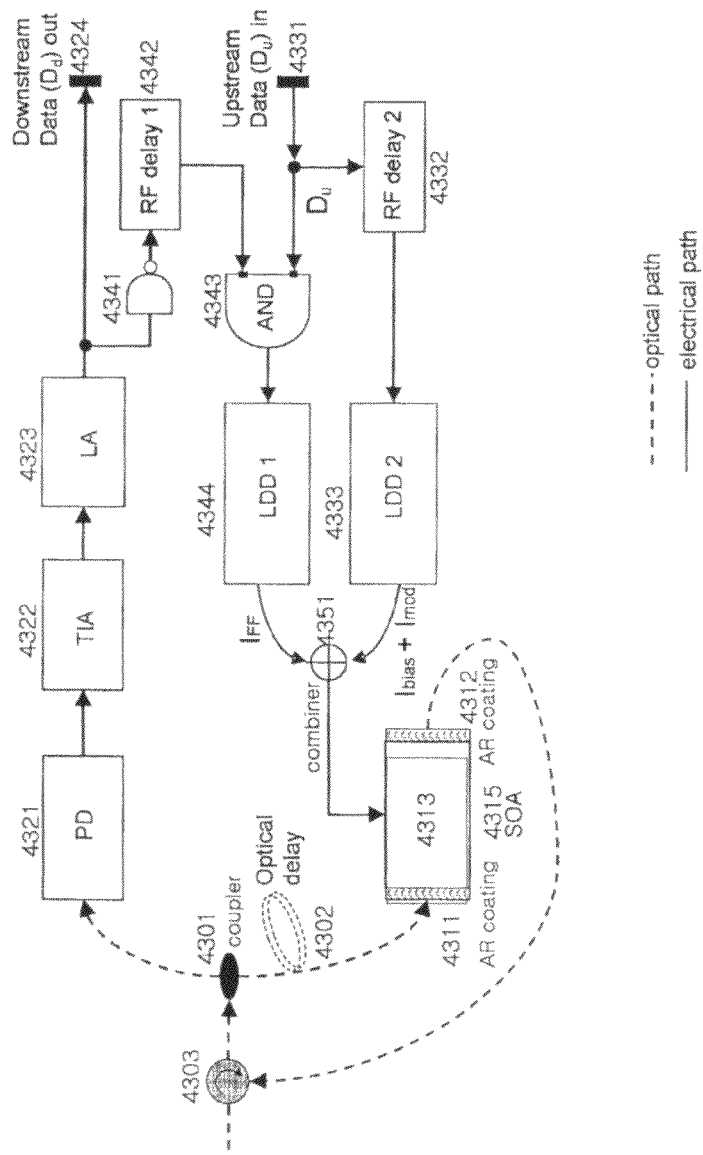
FIGS. 46 through 49 illustrate the structures of SOA-based input optical wavelength reusing apparatuses according to embodiments of the present invention.

The structure illustrated in FIG. 46 is basically the same as the structure illustrated in FIG. 43, except that a SOA 4315 is used instead of the RSOA 4310.

In order to transmit the output signal of the SOA 4315 to a network, a circulator 4303 is added. Unlike FIG. 22, a downstream optical signal is input through the front section 4311 of the SOA 4315, subjected to flattening, optical-amplification, and modulation by a upstream signal, and then output to the rear section 4312 of the SOA 4315.

Figure 47:
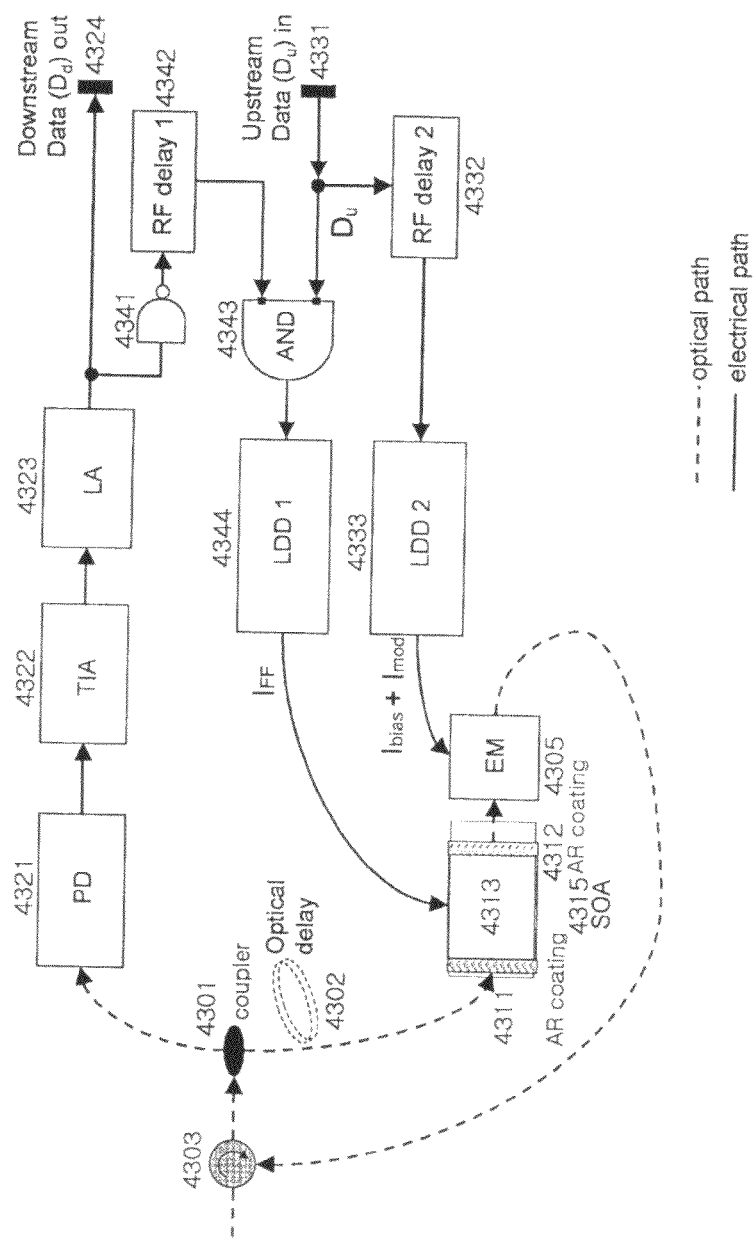

The structure illustrated in FIG. 47 is basically similar to the structure illustrated in FIG. 46, except that the output signal of the first LDD 4344 is injected to the SOA 4315, and the output signal of the second LDD 4333 is injected to the EM 4305. Accordingly, the SOA 4315 performs flattening and amplification on an input optical signal using a FFCI, and light modulation by upstream data is performed by the EM 4305.

Figure 48:
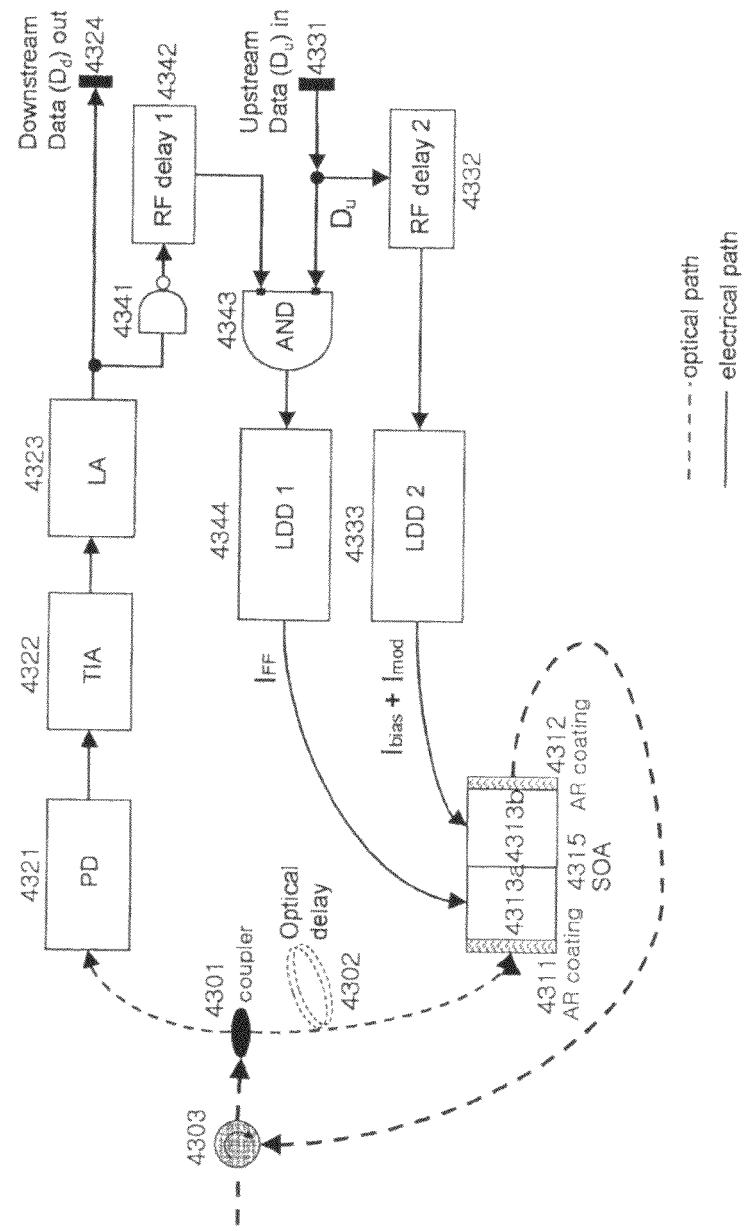

The structure illustrated in FIG. 48 is basically similar to the structure illustrated in FIG. 46, except that an active region of the SOA 4315 is divided into two sections.

The output signal of the first LDD 4344 is injected to the front section 4313a of the SOA 4315, and the output signal of the second LDD 4334 is injected to the rear section 4313b of the SOA 4315. In the front section 4313a of the SOA 4315, the input optical signal is subjected to flattening and amplification by the FFCI, and in the rear section 4313b of the SOA 4315, light modulation by the upstream data is performed.

Figure 49:
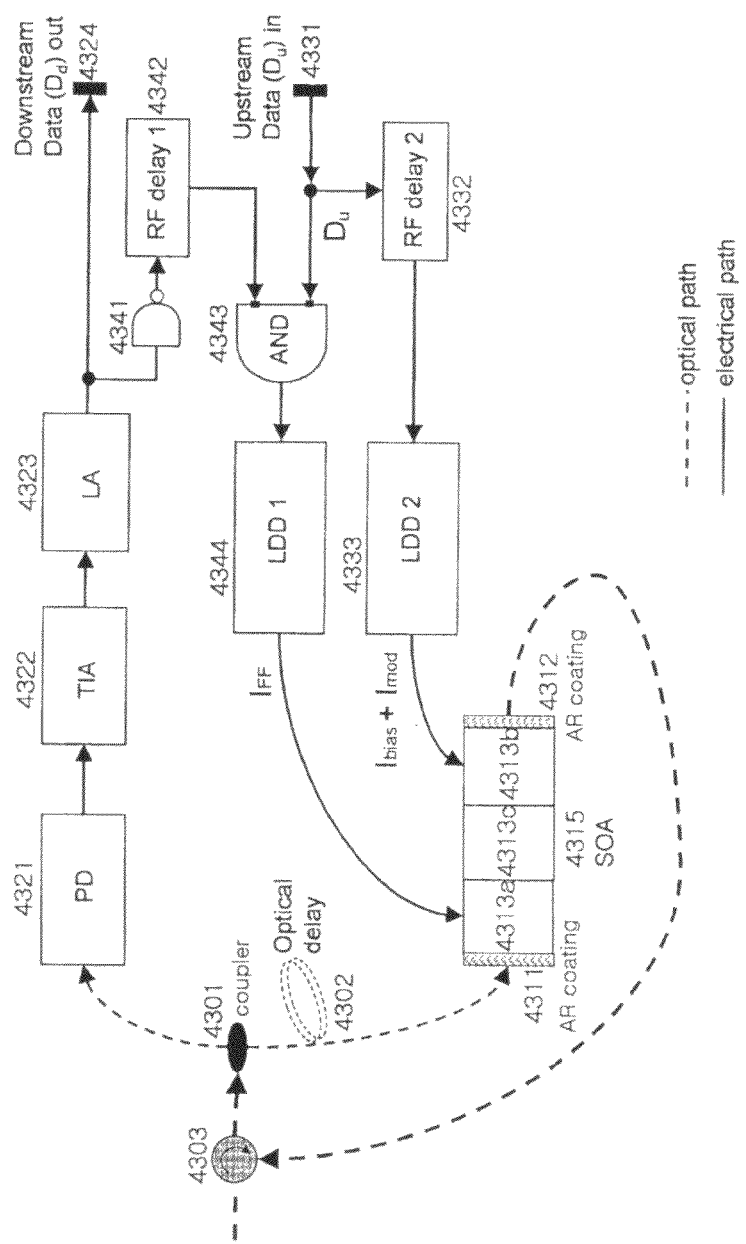

The structure illustrated in FIG. 49 is basically similar to the structure illustrated in FIG. 46, except that an active region of the SOA 4315 is divided into three sections.

The output signal of the first LDD 4344 is injected to the front section 4313a of the SOA 4315, and the output signal of the second LDD 4333 is injected to the rear section 4313b of the SOA 4315.

Accordingly, the front section 4313a of the SOA 4315 flattens the input optical signal by the FFCI, the intermediate section 4313c of the SOA 4315 amplifies the optical signal, and the rear section 4313b of the SOA 4315 performs light modulation by upstream data on the resultant optical signal.

Figure 50:
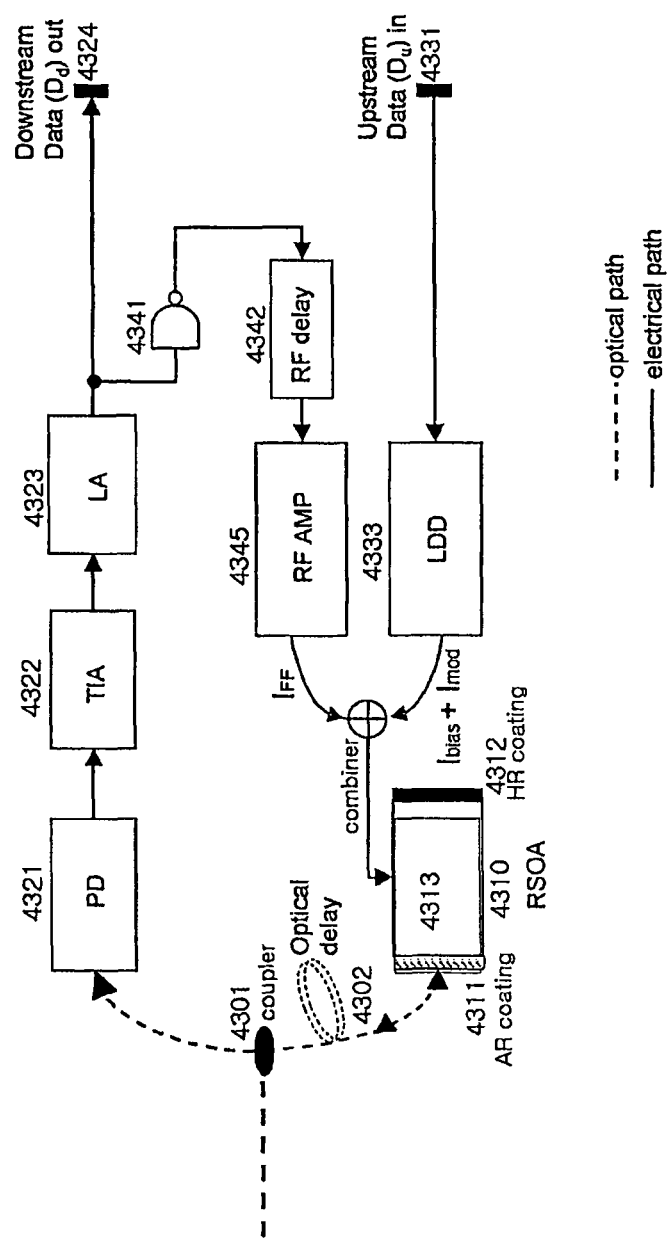
FIG. 50 illustrates the structure of a simplified input optical wavelength reusing apparatus using an output signal of a Limiting Amplifier (LA) to reuse an optical signal in put to a RSOA as a light for transmission, according to an embodiment of the present invention.

FIG. 50 illustrates the structure of a simplified input optical wavelength reusing apparatus using a LA output to reuse an optical signal received to a RSOA as a light for transmission, according to an embodiment of the present invention.

Referring to FIG. 50, a simplified input optical wavelength reusing method using the output signal of an LA 4323 to reuse an optical signal received to a RSOA as a light for transmission will be described below.

Some of the output signal of the limiting amplifier 4323 are inverted in polarity by an inverter 4341, pass through an RF delay 4342, and then are amplified to an appropriate size by an RF amplifier (AMP) 4345.

Meanwhile, a upstream data signal is converted into a current signal by a LDD 4333, and then output together with bias current. The output signal of the RF amplifier 4345 and the output signal of the LDD 4333 are combined by a combiner 4351 and then injected to a RSOA 4310.

If the LA 4323 includes a terminal for inverting the polarity of a signal, the output signal of the terminal is used as it is without passing through the inverter 4341.

Figure 51:
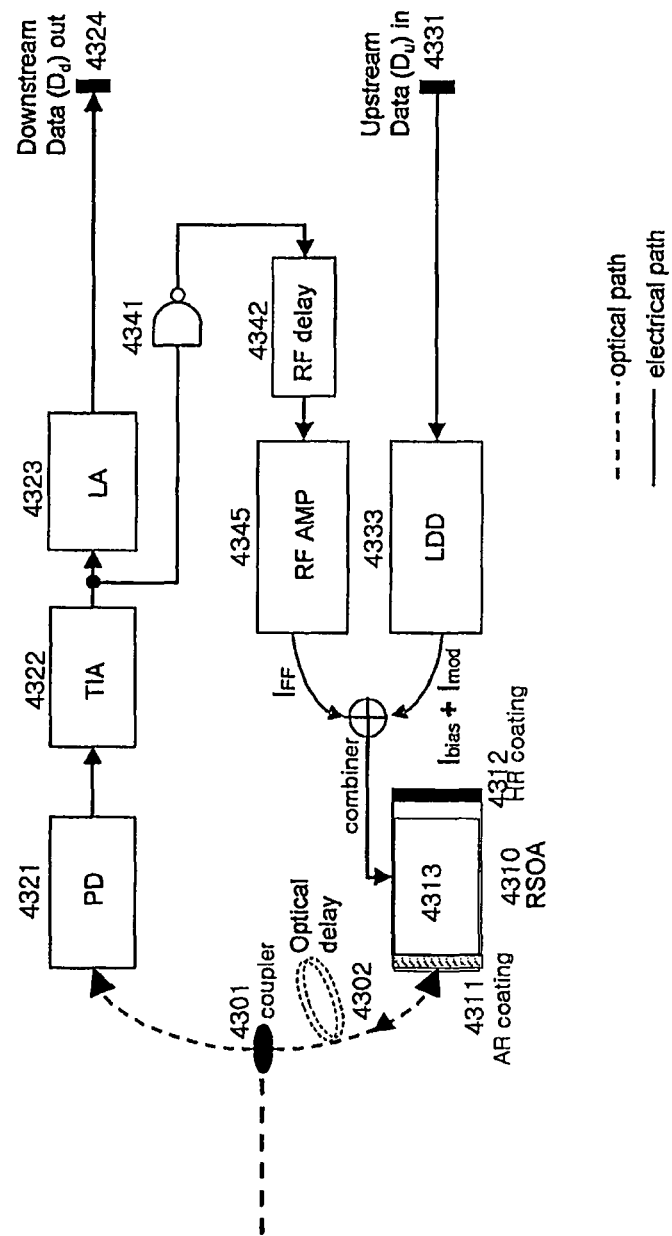
FIG. 51 illustrates the structure of a simplified input optical wavelength reusing apparatus using an output signal of a Transimpedance Amplifier (TIA) to reuse an optical signal input to an RSOA as a light for transmission, according to an embodiment of the present invention.

FIG. 51 illustrates the structure of a simplified input optical wavelength reusing apparatus using a transimpedance amplifier (TIA) output to reuse an optical signal received to an RSOA as a light for transmission, according to an embodiment of the present invention.

Some of the output signal of the transimpedance amplifier 4322 are inverted in polarity by the inverter 4341, pass through the RF delay 4342, and are amplified to an appropriate size by the RF amplifier 4345.

Meanwhile, an upstream data signal is converted to a current signal in the LDD 4333, and output together with bias current. The output signal of the RF AMP 4345 and the output signal of the LDD 4333 are combined by the combiner 4351 and then injected to the RSOA 4310.

If the TIA 4322 includes a terminal for inverting the polarity of a signal, the output signal of the terminal is used as it is without passing through the inverter 4341.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A driving apparatus of a Reflective Semiconductor Optical Amplifier (RSOA), the apparatus comprising:
   a coupler splitting an input optical signal to a first optical signal and a second optical signal;
   a RSOA having a single active region which reflects the second optical signal from a reflective facet and to which a combination of a signal having polarity opposite to the second optical signal and a signal for modulating the second optical signal reflected from the reflective facet to generate an output optical signal is injected;
   a photo diode converting the first signal into a current signal;
   a transimpedance amplifier amplifying and converting the current signal transmitted from the photo diode into a voltage signal;
   a limiting amplifier re-amplifying the voltage signal transmitted from the transimpedance amplifier;
   a first RF delay circuit adjusting a phase of the signal output from the limiting amplifier and a phase of the input optical signal to the RSOA in such a manner that the intensity of input optical signal input to the RSOA is optimally flattened;
   an AND gate passing an output signal of the first RF delay circuit therethrough when a upstream signal has a level '1', and preventing the output signal of the first RF delay circuit from passing therethrough when the upstream signal has a level '0';
   a second RF delay circuit optimally adjusting a phase of a upstream signal input to the AND gate and a phase of a upstream signal transmitted through the second RF delay;
   an optical delay line optically compensating for electrical delay through the first RF delay circuit;
   a first LD driver converting an output signal of the AND gate into a current signal; and
   a second LD driver converting an output signal of the second RF delay circuit to a current signal.

2. The driving apparatus of claim 1, further comprising:
   an RF delay circuit delaying an output time of the flattening signal transmitted from the RF amplifier so that the second optical signal is optimally flattened; and
   a signal combiner combining the flattening signal transmitted from the RF delay unit with the signal for modulating the second optical signal to generate the output optical signal, and injecting the combined signal to a single active region of a RSOA.

3. The driving apparatus of claim 2, further comprising a limiting amplifier re-amplifying the voltage signal transmitted from the transimpedance amplifier and transmitting the re-amplified voltage signal having polarity opposite to that of the first optical signal, to the RF amplifier.

4. A downstream optical transmission apparatus using a wavelength agnostic optical transmitters, which is used in an optical line terminal (OLT) of a Wavelength-Division-Multiplexed Passive Optical Network (WDM-PON), comprising:
   a seed light unit generating a multi-wavelength optical signal;
   a wavelength multiplexing/demultiplexing unit dividing the multi-wavelength optical signal according to wavelengths;
   optical transmitters generating downstream optical signals, using optical signals received from the seed light unit via the wavelength multiplexing/demultiplexing unit, in response to a plurality of electrical signals received from an external device; and
   a circulator transmitting the multi-wavelength optical signal to the wavelength multiplexing/demultiplexing unit, and transmitting optical signals from optical transmitters via the wavelength multiplexing/demultiplexing unit toward subscribers,
   wherein the wavelength multiplexing/demultiplexing unit wavelength-multiplexes downstream optical signals generated by the optical transmitters and further wherein a bandwidth $BW_{MWS}$ of the seed light unit is less than or equal to $N \times \Delta\lambda_{WDM}$, where N is a number of available channels and $\Delta\lambda_{WDM}$ is a channel interval of the WDM-PON, and a WDM channel Pass bandwidth $\Delta\lambda_{passband}$ of the wavelength multiplexing/demultiplexing unit is greater than or equal to an output wavelength interval $\Delta\lambda_{MWS}$ of the seed light unit.

5. The apparatus of claim 4, wherein the seed light unit generates wavelength-multiplexed optical signals, and includes an erbium-doped fiber or a Semiconductor amplifier.

6. The apparatus of claim 4, wherein the WDM channel pass bandwidth $\Delta\lambda_{passband}$ is less than or equal to 1.2 nm when the wavelength multiplexing/demultiplexing unit has a wavelength interval of 200 GHz.

7. The apparatus of claim 4, wherein the optical transmitters are wavelength agnostic semiconductor amplifiers.

8. An downstream optical transmission apparatus using wavelength agnostic optical transmitters, which is used in a Wavelength-Division-Multiplexed Passive Optical Network (WDM-PON), comprising:
   an seed light unit generating wavelength-multiplexed broad-band optical signals;
   a wavelength multiplexing/demultiplexing unit dividing the wavelength-multiplexed broad-band optical signal according to wavelengths;
   an optical transmission unit generating downstream optical signals, using optical signals received from the wavelength multiplexing/demultiplexing unit, in response to a plurality of electrical signals received from an external device; and
   a circulator transmitting the broad-band optical signal to the wavelength multiplexing/demultiplexing unit, and transmitting optical signals from optical transmitters via the wavelength multiplexing/demultiplexing unit toward subscribers,
   wherein the wavelength multiplexing/demultiplexing unit wavelength-multiplexes a plurality of downstream optical signals generated by the optical transmitters and further wherein a bandwidth $BW_{MWS}$ of the seed light unit is less than or equal to $N \times \Delta\lambda_{WDM}$, where N is a number of available channels and $\Delta\lambda_{WDM}$ is a channel interval of the WDM-PON, and a WDM channel pass bandwidth $\Delta\lambda_{passband}$ of the wavelength multiplexing/demultiplexing unit is greater than or equal to an output wavelength interval $\Delta\lambda_{MWS}$ of the seed light unit.

9. The apparatus of claim 8, wherein the seed light unit generates wavelength-multiplexed broadband optical signals and includes a semiconductor Superluminescent LED (SLD), an erbium-doped fiber amplifier, or a semiconductor optical amplifier.

10. The apparatus of claim 8, wherein a total bandwidth $BW_{BLS}$ of the seed light unit is equal to or greater than $N \times \Delta\lambda_{WDM}$,
   where N is the number of available channels of the WDM-PON and $\Delta\lambda_{WDM}$ is a channel interval of the WDM-PON.

11. The apparatus of claim 10, wherein the wavelength multiplexing/demultiplexing unit produces a WDM channel pass bandwidth $\Delta\lambda_{passband}$ which is less than or equal to 1.2 nm when a wavelength interval is 200 GHz.

12. The apparatus of claim 8, wherein the optical transmitters are wavelength agnostic semiconductor optical amplifiers.

13. A downstream optical transmission method using wavelength agnostic optical transmitters which are included in an optical line terminal (OLT) of a Wavelength-Division-Multiplexed Passive Optical Network (WDM-PON), comprising:
   generating a multi-wavelength optical signal using a multi-wavelength light source;
   dividing the multi-wavelength optical signal according to wavelengths;
   generating a plurality of downstream optical signals using each optical signal received and divided according to the wavelengths, in response to a plurality of electrical signals received from an external device; and
   wavelength-multiplexing the plurality of downstream optical signals, and transmitting the WDM signals to a subscriber party through an optical line,
   wherein a bandwidth $BW_{MWS}$ of the multi-wavelength light is less than or equal to $N\Delta\Delta\lambda_{WDM}$, where N is a number of available channels of the WDM-PON, and $\Delta\lambda_{WDM}$ is a channel interval of the WDM-PON.

14. A downstream optical transmission method using a wavelength agnostic optical transmitters, which are included in an optical line terminal (OLT) of a Wavelength-Division-Multiplexed Passive Optical Network (WDM-PON), comprising:
   generating wavelength-multiplexed broad-band optical signals using a broad-band light source (BLS);
   dividing the wavelength-multiplexed broad-band optical signal according to wavelengths;
   generating a plurality of downstream optical signals using each optical signal received and divided according to the wavelengths, in response to a plurality of electrical signals received from an external device;
   wavelength-multiplexing the plurality of downstream optical signals, and transmitting the result of the WDM signals to a subscriber party through an optical line; and
   a seed light unit generating one of multi-wavelength optical signals and wavelength-multiplexed broad-band optical signals wherein a bandwidth $BW_{MWS}$ of the seed light unit is less than or equal to $N \times \Delta\lambda_{WDM}$, where N is a number of available channels of the WDM-PON, and $\Delta\lambda_{WDM}$ is a channel interval of the WDM-PON.

15. The method of claim 13, wherein the generating of the plurality of downstream optical signals comprises generating the plurality of downstream optical signals using a plurality of wavelength agnostic semiconductor optical amplifiers.

16. An Optical Line Terminal (OLT) including wavelength agnostic optical transmitters, which is used in a Wavelength-Division-Multiplexed Passive Optical Network (WDM-PON), comprising:
   a protocol processing unit protocol-processing a downstream electrical signal that is to be transmitted to a subscriber party or a upstream electrical signal transmitted from the subscriber party;
   a seed light unit generating one of multi-wavelength optical signals and wavelength-multiplexed broad-band optical signals wherein a bandwidth $BW_{MWS}$ of the seed light unit is less than or equal to $N \times \Delta\lambda_{WDM}$, where N is a number of available channels of the WDM-PON, and $\Delta\lambda_{WDM}$ is a channel interval of the WDM-PON;
   downstream optical transmission unit generating a plurality of downstream optical signals in response to each downstream electrical signal output from the protocol processing unit, using one of the multi-wavelength optical signals and the wavelength-multiplexed broad-band optical signals, and wavelength-multiplexing the plurality of downstream optical signals;
   a circulator transmitting the WDM downstream optical signals to a subscribe party through an optical line; and
   a upstream optical receiving unit receiving WDM upstream optical signals transmitted from the subscriber party through the optical line, via the circulator, dividing the WDM upstream optical signal according to wavelengths, converting each optical signal into an electrical signal, and outputting the electrical signal to the protocol processing unit.

* * * * *